United States Patent
Watanabe

Patent Number: 5,920,092
Date of Patent: Jul. 6, 1999

[54] ACTIVE TYPE PHOTOELECTRIC CONVERSION DEVICE, METHOD FOR FABRICATING THE SAME, AND ACTIVE TYPE SOLID-STATE IMAGING DEVICE

[75] Inventor: Takashi Watanabe, Soraku-gun, Japan

[73] Assignee: Sharp Kabushiki Kaisha, Osaka, Japan

[21] Appl. No.: 08/928,321

[22] Filed: Sep. 12, 1997

[30] Foreign Application Priority Data

Nov. 1, 1996 [JP] Japan ................... 8-292149

[51] Int. Cl.⁶ ............. H01L 31/062; H01L 31/113
[52] U.S. Cl. ............. 257/292; 257/231; 257/236; 257/249; 257/291
[58] Field of Search ................... 257/231, 236, 257/249, 291, 292

[56] References Cited

U.S. PATENT DOCUMENTS

| | | | |
|---|---|---|---|
| 5,486,711 | 1/1996 | Ishida | 257/258 |
| 5,780,884 | 7/1998 | Kumagai et al. | 257/236 |
| 5,844,234 | 12/1998 | Kawazoe | 257/232 |

FOREIGN PATENT DOCUMENTS

| | | |
|---|---|---|
| 6-1826 | 1/1994 | Japan . |
| 8-78653 | 3/1996 | Japan . |
| 8-250697 | 9/1996 | Japan . |

OTHER PUBLICATIONS

C. Nakamura, et al., *1986 Television Academy*, p. 57, 1986.
J. Hynecek, *IEEE Transactions on Electron Devices*, vol. 35, No. 5 pp. 646–652, 1988.
J. Hynecek, *IEEE Transactions on Electron Devices*, vol. 38, No. 5 pp. 1101–1020, 1991.
K. Matsumoto, et al., *IEEE Transactions on Electron Devices*, vol. 38, No. 5, pp. 989–998, 1991.
E.R. Fossum, *IEEE IDEM 95*, pp. 17–25, 1995.

*Primary Examiner*—Ngân V. Ngô
*Attorney, Agent, or Firm*—Dike, Bronstein, Roberts & Cushman, LLP; David G. Conlin

[57] ABSTRACT

An active type photoelectric conversion device includes a pixel having a photoelectric conversion area and a gate area which are formed in a surface portion of a semiconductor substrate of a first conductivity type. The photoelectric conversion area includes a first semiconductor layer of a second conductivity type formed in the surface portion of the semiconductor substrate; a second semiconductor layer of the first conductivity type formed on the first semiconductor layer; and a FET including a drain and a source of the second conductivity type formed from the surface of the semiconductor substrate through the second semiconductor layer and a first gate electrode formed on the second semiconductor layer with an insulating layer therebetween, the FET generating signal charges by photoelectric conversion of light incident on the semiconductor substrate through the first gate electrode and the insulating layer, accumulating the signal charges in the second semiconductor layer, and generating an output signal corresponding to the signal charges. The gate area includes a second gate electrode formed on the semiconductor substrate with an insulating layer therebetween, the second gate electrode allowing the signal charges accumulated in the second semiconductor layer in the photoelectric conversion area to flow toward the semiconductor substrate in accordance with an applied voltage to the second semiconductor layer. The second semiconductor layer of the first conductivity type is depleted depending on the applied voltage.

7 Claims, 14 Drawing Sheets

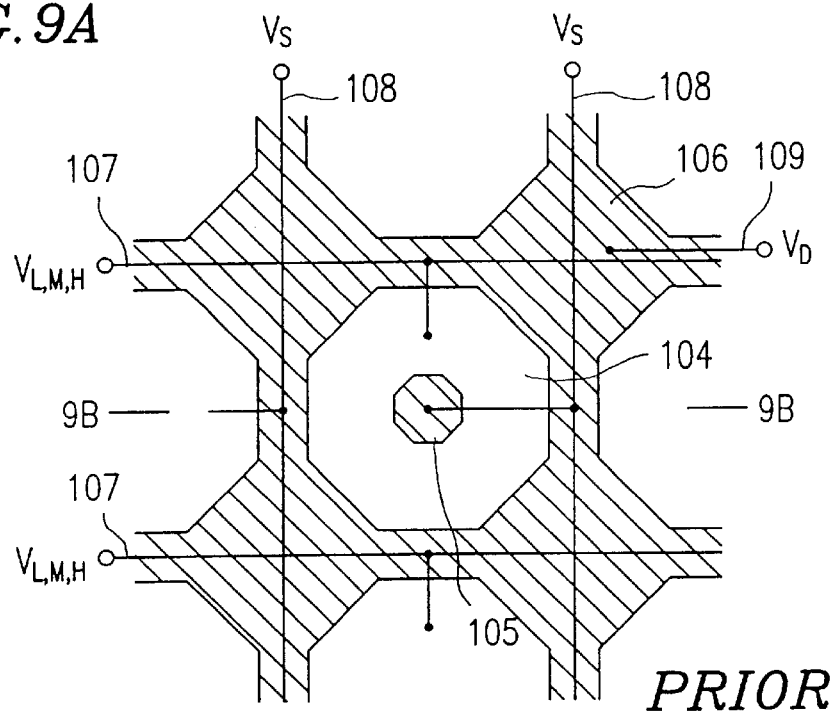
FIG. 9A  *PRIOR ART*
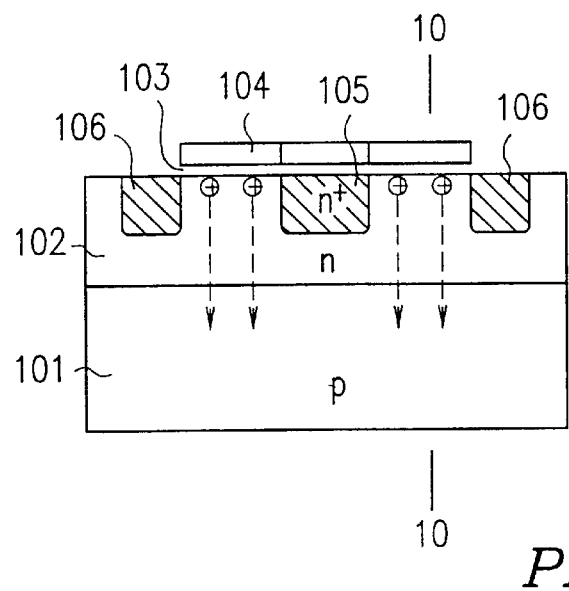
FIG. 9B  *PRIOR ART*

PRIOR ART

PRIOR ART

PRIOR ART

PRIOR ART

ACTIVE TYPE PHOTOELECTRIC CONVERSION DEVICE, METHOD FOR FABRICATING THE SAME, AND ACTIVE TYPE SOLID-STATE IMAGING DEVICE

BACKGROUND OF THE INVENTION

1. Field of the Invention

The present invention relates to an active type photoelectric conversion device using a metal-oxide-semiconductor field effect transistor (MOSFET). More particularly, the present invention relates to an active type photoelectric conversion device which can realize an excellent performance and a lower driving voltage, a method for fabricating such an active type photoelectric conversion device, and an active type solid-state imaging device using such an active type photoelectric conversion device.

2. Description of the Related Art

A charge-coupled device (CCD) where signal charges themselves generated in respective pixels are read is currently the most popular among other photoelectric conversion devices. An active type photoelectric conversion device has recently been proposed to replace the CCD, where signal charges are first amplified in respective pixels and then sequentially read by a scanning circuit. By the amplification of signal charges in the respective pixels, a sufficient amount of signal charges for reading can be secured and the dynamic range becomes broader than that of the CCD. Moreover, in such a device, the signal charges can only be read by driving the horizontal and vertical lines, as well as selective switches connected to pixels to be read, with a smaller voltage. Therefore, a smaller amount of power consumption is required than that of the CCD.

In such a photoelectric conversion device, a transistor is generally employed to amplify the signal charges in a pixel. Transistors are classified into a SIT type, a bipolar type, a FET type (a MOSFET or a junction type FET), and the like. In the SIT type and the bipolar type, the transistor structure is formed in the depth direction of a semiconductor substrate, while in the MOSFET type it is formed along the surface of the semiconductor substrate. The MOSFET type therefore provides a simpler configuration and easier fabrication for the formation of scanning circuits for pixels.

It is advantageous to use a device in which a single MOSFET is contained inside a pixel in order to increase the pixel density. A charge modulation device (CMD) type, a floating gate array (FGA) type, a bulk charge modulated device (BCMD) type, and the like have been reported as examples of devices having a single FET in each pixel.

FIGS. 9A and 9B show pixels of a conventional CMD type active type photoelectric conversion device. FIG. 9A is a plan view of the pixels, and FIG. 9B is a sectional view taken along line 9B—9B of FIG. 9A. The CMD type photoelectric conversion device is described in Nakamura et al., "Gate-accumulation type MOS phototransistor image sensor", 1986 Television Academy, p. 57.

As shown in FIG. 9B, an n-type well 102 is formed as a buried channel in a p-type substrate 101. A gate electrode 104 is formed on the n-type well 102 with an insulating film 103 therebetween. A source region 105 and a drain region 106, composed of a highly-concentrated n-layer and separated by the n-type well 102, are formed in the n-type well 102 at the surface thereof.

As shown in FIG. 9A, the gate electrodes 104 of the respective pixels are connected in common to gate terminals 107 in a horizontal direction, and the source regions 105 are connected in common to source terminals 108 in a vertical direction. The drain regions 106 form a mesh pattern and are connected to drain terminals 109. In this way, the pixels are arranged in a matrix, so as to complete the CMD type active type photoelectric conversion device.

The operation of the CMD type active type photoelectric conversion device will be described.

FIG. 10 shows a potential distribution in the depth direction of the device along line 10—10 of FIG. 9B. First, at the signal accumulation, a gate voltage $V_L$ is applied to the gate electrodes 104 of the pixels lined in a horizontal row via the gate terminal 107. By this application of the gate voltage, signal charges (holes) generated by photoelectric conversion are accumulated at an interface between the semiconductor (n-type well 102) and the insulating film 103 in the pixels.

At the signal reading, the gate voltage is increased to a voltage $V_M$ from the voltage $V_L$. In response to this voltage change, a current flows between the drain region 106 and the source region 105 of each transistor. The current value changes depending on the amount of the accumulated signal charges. The changed current value is read via the source terminal 108 as a signal output. Signal charges accumulated in the other pixels connected to the same source terminal 108 are not read because the gate voltage $V_L$ is applied to the gate electrodes 104 in these pixels via the other gate terminals 107.

When the accumulated signal charges in the pixels are cleared, the gate voltage is changed to a voltage $V_H$, so as to provide a potential gradient where the voltage monotonously decreases in the depth direction. This allows the signal charges (holes in this case) accumulated at the interface between the n-type well 102 and the insulating film 103 to be drained right below toward the p-type substrate 101 as shown by dash-line arrows in FIG. 9B. This also serves as the reset for the next signal accumulation.

FIG. 11A is a sectional view of a pixel of a conventional FGA type active type photoelectric conversion device. FIG. 11B shows a potential distribution in the depth direction of the device along line 11B—11B of FIG. 11A. The prior art device shown in these figures is described in J. Hynecek, "A New Device Architecture suitable for High-Resolution and High-Performance Image Sensor", IEEE Trans. Elec. Dev. Vol. 35, No. 5, p 646 (1988).

The FGA type photoelectric conversion device is different from the CMD type one in that a p-layer 110 with a high impurity concentration is provided on the n-type well 102 under the gate electrode 104, as shown in FIG. 11A.

A gate voltage is set to be $V_L$ at the signal accumulation and the signal reading, and the variation in the channel potential at the n-type well 102 in accordance with the accumulation of the signal charges in the p-layer 110 is detected and read as a variation in the threshold value. The other pixels on the same signal line are not detected because the gate voltage is in a $V_L$ level only at the signal reading.

At the resetting, as in the case of the CMD type one, the gate voltage is set to be $V_H$, so as to provide a potential gradient where the voltage monotonously decreases in the depth direction. This allows the signal charges accumulated in the p-layer 110 to be drained right below toward the p-type substrate 101.

FIG. 12A is a sectional view of a pixel of a BCMD type active type photoelectric conversion device. FIG. 12B shows a potential distribution in the depth direction along line 12B—12B of FIG. 12A. The prior art device shown in these figures is described in J. Hynecek, "BCMD—An Improved Photosite Structure for High Density Image Sensor", IEEE Trans. Elec. Dev. Vol. 38, No. 5, p 1011 (1991).

As shown in FIG. 12A, each pixel of the BCMD type photoelectric conversion device includes a p-layer 112, an n-layer 113, and a p-layer 114 stacked in this order on an n-type substrate 111. P-layers 115 with a high impurity concentration are formed as source and drain electrodes to reach the p-layer 112 through the n-layer 113 and the p-layer 114.

The BCMD type photoelectric conversion device is different from the FGA type one in the following points: (1) The signal charges are converted into electrons and accumulated in the buried channel n-layer 113; (2) The potential variation at the p-layer 114 caused by the signal charges is detected as a variation in the threshold value of the p-MOS structure; (3) At the resetting, the gate voltage is set to be the lower voltage $V_L$ to drain the signal charges to the n-type substrate 111. With these features, the complete transfer of the signal charges is accomplished.

However, the above CMD type, FGA type, and BCMD type photoelectric conversion devices have a problem in that the driving voltages are high. In order to overcome this problem, the inventors of the present invention have proposed an active type photoelectric conversion device which can lower the driving voltages by providing two different gates in each pixel (Japanese Laid-Open Publication No. 8-78653). Hereinbelow, this type of photoelectric conversion device is referred to as a twin gate MOS image sensor (TGMIS) type photoelectric conversion device.

FIG. 13A is a sectional view of a pixel of a conventional TGMIS type active type photoelectric conversion device.

Referring to FIG. 13A, a first gate electrode 123 and a second gate electrode 124 are formed on a p-type semiconductor substrate 121 with an insulating film 122 therebetween. An n-layer 125 is formed in a surface portion of the semiconductor substrate 121 under the first gate electrode 123, and a pair of n+-type diffusion layers are formed in the n-layer 125, forming a source region 126 and a drain region 127 of an MOSFET with the first gate electrode 123 serving as a gate. The source region 126 of each pixel is connected to a common source terminal 128, while the drain region 127 of each pixel is connected to a common drain terminal 129.

In the above structure, light hv incident through the first gate electrode 123 generates electron-hole pairs by photoelectric conversion, and the generated electrons flow into the drain region 127. The holes are confined by a barrier formed in the middle of the n-layer 125 and a barrier formed under the second gate electrode 124, and turned into signal charges accumulated at the interface between the n-layer 125 and the insulating film 122. The potential at the n-layer 125 varies in accordance with the amount of the signal charges. This variation of the potential is detected and read as a potential variation at the source region 126 and regarded as an output signal. At the resetting, the potential barrier formed under the second gate electrode 124 is reduced to allow the signal charges to be drained to the p-type semiconductor substrate 121 via a route shown by the dash-line arrow in FIG. 13A.

FIG. 13B shows potential distributions in the depth direction of the device along lines $13B_A$—$13B_A$ and $13B_B$—$13B_B$ of FIG. 13A. Solid lines 131, 132, 133, and 134 represent the potential distribution obtained along line $13B_A$—$13B_A$, while dash lines 135 and 136 represent the potential distribution obtained along line $13B_B$—$13B_B$.

At the accumulation of the signal charges, a negative voltage $V_A(L)$ is applied to the first gate electrode 123, while a positive low voltage $V_B(L)$ is applied to the second gate electrode 124. The amount of the signal charges (holes) accumulated at the surface of the n-layer 125 under the first gate electrode 123 varies from zero to a saturation level. With this variation, the potential distribution under the first gate electrode 123 changes from the state shown by the solid line 131 to the state shown by the solid line 132. On the contrary, the potential distribution under the second gate electrode 124 does not change, keeping the state shown by the dash line 135.

A potential difference $\Delta V_P$ between the potential value at the crossing of the solid line 131 and the dash line 135 and a surface potential of the semiconductor substrate 121 serves as a barrier for preventing charges from flowing from the semiconductor substrate 121 when no signal charge is accumulated. A potential difference $\Delta V_Q$ between the potential value at the crossing of the solid line 132 and the dash line 135 and a potential at the surface of the semiconductor substrate 121 in the state shown by the solid line 132 serves as a barrier corresponding to the saturation level of the signal charges, allowing excessive signal charges to override the barrier to be drained to the semiconductor substrate 121.

At the reading of the signal charges, a voltage $V_A(H)$ higher than the voltage $V_A(L)$ is applied to the first gate electrode 123, while a voltage $V_B(H)$ higher than the voltage $V_B(L)$ is applied to the second gate electrode 124. With this change of the applied voltage to the first gate electrode 123, the potential distribution under the first gate electrode 123 changes from the state shown by the solid line 131 to the state shown by the solid line 133 if no signal charge has been accumulated under the first gate electrode 123. If signal charges have been accumulated to the saturation level, the potential distribution under the first gate electrode 123 changes from the state shown by the solid line 132 to the state shown by the solid line 134. On the contrary, the potential distribution under the second gate electrode 124 changes from the state shown by the dash line 135 to the state shown by the dash line 136 depending on the change of the applied voltage to the second gate electrode 124.

Assume that the potential values at the bottom of the solid lines 133 and 134 are voltages $V_{SO}$ and $V_{SM}$, respectively. When a constant current load is connected to the source region 126 and a voltage $V_D$ higher than the voltage $V_{SM}$ is applied to the drain region 127, the potential at the source region 126 is either the voltage $V_{SO}$ or $V_{SM}$ depending on whether or not signal charges have been accumulated (i.e., depending on the solid line 133 or 134). Thus, an output depending on the amount of the signal charges can be obtained.

A potential difference $\Delta V_R$ between the potential value at the crossing of the solid line 134 and the dash line 136 and a potential at the surface of the semiconductor substrate 121 in the state shown by the solid line 134 serves as a barrier for preventing signal charges below the saturation level from flowing into the semiconductor substrate 121. A potential difference $\Delta V_T$ between the bottom of the solid lines 132 and 133 serves as a barrier which allows a current to flow only into the source region 126 of the pixel for reading but not into the source region 126 of the pixel for accumulation when the source regions 126 of the pixel for reading and the pixel for accumulation are connected to a common source terminal.

At the resetting, the voltage $V_A(H)$ (the voltage applied at the reading) is applied to the first gate electrode 123, while the voltage $V_B(L)$ (the voltage applied at the accumulation) is applied to the second gate electrode 124. With this application, the surface potential at the semiconductor substrate 121 under the second gate electrode 124 is lower than the surface potential at the n-layer 125 under the first gate electrode 123 by at least $\Delta V_F$. This allows all the signal charges (holes) accumulated in the surface portion of the n-layer 125 under the first gate electrode 123 to be drained to the semiconductor substrate 121 via a route under the second gate electrode 124.

The potential difference $\Delta V_F$ is more than zero and represents the relationship between the potentials at the surfaces of the semiconductor substrate 121 under the first gate electrode 123 and the second gate electrode 124 (shown by the solid line 133 and the dash line 135) required for complete drainage of the signal charges at the resetting.

For the quantitative representation of the above TGMIS type active type photoelectric conversion device, Condition 1 as follows is assumed.

[Condition 1]
Impurity concentration of substrate: $N_B = 1.0 \times 10^{15}$ cm$^{-3}$
Impurity concentration of n-layer: $N_N = 3.0 \times 10^{15}$ cm$^{-3}$
Thickness of n-layer: $d_N = 1.5$ μm
Thickness of oxide insulating film: $d_o = 80$ nm (first and second gate electrodes 123 and 124 have the same thickness)
Amount of signal charges at saturation level: $Q_{SAT} = 5 \times 10^{11}$ cm$^{-2}$
Material of first and second gate electrodes 123 and 124: n$^+$-doped polysilicon film The voltages shown in FIG. 13B are set as follows:
$V_A(L) = -3.0$ V, $V_A(H) = 0.0$ V
$V_B(L) = 1.0$ V, $V_B(H) = 5.0$ V
$\Delta V_P = 0.78$ V
$\Delta V_Q = 0.5$ V
$\Delta V_R = 0.58$ V
$\Delta V_T = 0.74$ V
$\Delta V_F = 0.25$ V The voltage difference $\Delta V_P$ should be preferably about 0.8 V or more for preventing charges from flowing in. The voltage difference $\Delta V_Q$ should be preferably about 0.5 V or less for allowing excessive charges to be drained. The voltage difference $\Delta V_T$ should be preferably 0.7 V or more for distinguishing the ON-OFF characteristics of pixels for reading and pixels for accumulation. The voltage difference $\Delta V_F$ requires to be 0.0 V or more where no barrier is formed. The above values for $\Delta V_P$, $\Delta V_Q$, $\Delta V_R$, $\Delta V_T$, and $\Delta V_F$ are therefore within the preferable ranges. This is because the set values of the voltages $V_A(L)$, $V_A(H)$, $V_B(L)$, and $V_B(H)$ are appropriate.

As described above, the conventional TGMIS type active type photoelectric conversion device has two gate electrodes in each pixel, and the driving voltages $V_A(L)$, $V_A(H)$, $V_B(L)$, and $V_B(H)$ can be set low. However, the combination of these driving voltages $V_A(L)$, $V_A(H)$, $V_B(L)$, and $V_B(H)$ includes both positive and negative voltages, complicating the configuration of the power sources for driving the photoelectric conversion device of this type.

An objective of the present invention is to provide an active type photoelectric conversion device which can be driven only by positive voltages, while maintaining the advantage of the aforementioned TGMIS type photoelectric conversion device of providing low driving voltages, and which can sufficiently suppress the generation of after images and reset noise. Other objectives of the present invention are to provide a method for fabricating such an active type photoelectric conversion device and provide an active type solid-state imaging device using such an active type photoelectric conversion device.

SUMMARY OF THE INVENTION

According to one aspect of the invention, an active type photoelectric conversion device includes a pixel having a photoelectric conversion area and a gate area which are formed in a surface portion of a semiconductor substrate of a first conductivity type. The photoelectric conversion area includes a first semiconductor layer of a second conductivity type formed in the surface portion of the semiconductor substrate; a second semiconductor layer of the first conductivity type formed on the first semiconductor layer; and a FET including a drain and a source of the second conductivity type formed from the surface of the semiconductor substrate through the second semiconductor layer and a first gate electrode formed on the second semiconductor layer with an insulating layer therebetween, the FET generating signal charges by photoelectric conversion of light incident on the semiconductor substrate through the first gate electrode and the insulating layer, accumulating the signal charges in the second semiconductor layer, and generating an output signal corresponding to the signal charges. The gate area includes a second gate electrode formed on the semiconductor substrate with an insulating layer therebetween, the second gate electrode allowing the signal charges accumulated in the second semiconductor layer in the photoelectric conversion area to flow toward the semiconductor substrate in accordance with an applied voltage to the second semiconductor layer. The second semiconductor layer of the first conductivity type is depleted depending on the applied voltage.

According to another aspect of the invention, a method for fabricating an active type photoelectric conversion device is provided. The active type photoelectric conversion device includes a pixel having a photoelectric conversion area and a gate area which are formed in a surface portion of a semiconductor substrate of a first conductivity type. The photoelectric conversion area includes a first semiconductor layer of a second conductivity type formed in the surface portion of the semiconductor substrate; a second semiconductor layer of the first conductivity type formed on the first semiconductor layer; and a FET including a drain and a source of the second conductivity type formed from the surface of the semiconductor substrate through the second semiconductor layer and a first gate electrode formed on the second semiconductor layer with an insulating layer therebetween, the FET generating signal charges by photoelectric conversion of light incident on the semiconductor substrate through the first gate electrode and the insulating layer, accumulating the signal charges in the second semiconductor layer, and generating an output signal corresponding to the signal charges. The gate area includes a second gate electrode formed on the semiconductor substrate with an insulating layer therebetween, the second gate electrode allowing the signal charges accumulated in the second semiconductor layer in the photoelectric conversion area to flow toward the semiconductor substrate in accordance with an applied voltage to the second semiconductor layer, wherein the second semiconductor layer of the first conductivity type is depleted depending on the applied voltage. The method includes the steps of: forming a first electrode layer on the semiconductor substrate of the first conductivity type with a first insulating layer therebetween and patterning the first electrode layer using a resist to form the second gate electrode; implanting ions in the semiconductor substrate at high energy using the second gate electrode and the resist as a mask to form the first semiconductor layer of the second conductivity type; implanting ions in the semiconductor substrate at low energy using at least the second gate electrode as a mask to form the second semiconductor layer of the first conductivity type; and forming a second electrode layer on the resultant surface with a second insulating layer therebetween and patterning the second electrode layer using a resist to form the first gate electrode.

According to still another aspect of the invention, a method for fabricating an active type photoelectric conversion device is provided. The active type photoelectric conversion device includes a pixel having a photoelectric conversion area and a gate area which are formed in a surface portion of a semiconductor substrate of a first conductivity type. The photoelectric conversion area includes a first semiconductor layer of a second conductivity type formed in the surface portion of the semiconductor substrate; a second semiconductor layer of the first conductivity type formed on the first semiconductor layer; and a FET including a drain and a source of the second conductivity type formed from the surface of the semiconductor substrate through the second semiconductor layer and a first gate electrode formed on the second semiconductor layer with an insulating layer therebetween, the FET generating signal charges by photoelectric conversion of light incident on the semiconductor substrate through the first gate electrode and the insulating layer, accumulating the signal charges in the second semiconductor layer, and generating an output signal corresponding to the signal charges. The gate area includes a second gate electrode formed on the semiconductor substrate with an insulating layer therebetween, the second gate electrode allowing the signal charges accumulated in the second semiconductor layer in the photoelectric conversion area to flow toward the semiconductor substrate in accordance with an applied voltage to the second semiconductor layer, wherein the second semiconductor layer of the first conductivity type is depleted depending on the applied voltage. The method includes the steps of: forming a first electrode layer on the semiconductor substrate of the first conductivity type with a first insulating layer therebetween and patterning the first electrode layer using a resist to form the second gate electrode; implanting ions in the semiconductor substrate at high energy using the second gate electrode and the resist as a mask to form the first semiconductor layer of the second conductivity type; forming a second insulating layer on the second gate electrode after removing the resist; implanting ions in the semiconductor substrate at low energy using the second gate electrode as a mask to form the second semiconductor layer of the first conductivity type; and forming a second electrode layer on the second insulating layer and patterning the second electrode layer using a resist to form the first gate electrode.

According to still another aspect of the invention, an active type solid-state imaging device includes an image sensor area having a plurality of active type photoelectric conversion devices arranged in a matrix and a driving circuit area for driving the plurality of active type photoelectric conversion devices. The driving circuit area includes a horizontal scanning circuit for horizontally scanning the plurality of active type photoelectric conversion devices for signal reading; and a vertical scanning circuit for vertically scanning the plurality of active type photoelectric conversion devices for signal reading. Each of the plurality of active type photoelectric conversion devices, including a pixel having a photoelectric conversion area and a gate area which are formed in a surface portion of a semiconductor substrate of a first conductivity type, includes a first semiconductor layer of a second conductivity type formed in the surface portion of the semiconductor substrate; a second semiconductor layer of the first conductivity type formed on the first semiconductor layer; and a FET including a drain and a source of the second conductivity type formed from the surface of the semiconductor substrate through the second semiconductor layer and a first gate electrode formed on the second semiconductor layer with an insulating layer therebetween, the FET generating signal charges by photoelectric conversion of light incident on the semiconductor substrate through the first gate electrode and the insulating layer, accumulating the signal charges in the second semiconductor layer, and generating an output signal corresponding to the signal charges. The gate area includes a second gate electrode formed on the semiconductor substrate with an insulating layer therebetween, the second gate electrode allowing the signal charges accumulated in the second semiconductor layer in the photoelectric conversion area to flow toward the semiconductor substrate in accordance with an applied voltage to the second semiconductor layer. The second semiconductor layer of the first conductivity type is depleted depending on the applied voltage.

In one embodiment of the invention, the driving circuit area further includes a level conversion circuit for generating voltages to be applied to the first and second gate electrodes of the plurality of active type photoelectric conversion devices.

In another embodiment of the invention, clock signal voltages applied to the driving circuit area are positive.

In still another embodiment of the invention, the image sensor area and the driving circuit area are formed on the semiconductor substrate of the first conductivity type.

Thus, according to the present invention, at the accumulation of signal charges, light is incident through the first gate electrode in the photoelectric conversion area of each pixel so as to generate charges by photoelectric conversion. The charges are accumulated under the first gate electrode. At the signal reading, the potential at the source in the photoelectric conversion area is read as the amount of the signal charges. At the resetting, the charges accumulated under the first gate electrode are drained toward the semiconductor substrate via a route under the second gate electrode in the gate area.

The above operations are performed by controlling the voltages at the first and second gate electrodes. The voltages at the second gate electrode are composed of a high level voltage and a low level voltage which are both positive (or negative) as in the prior art also shown in FIGS. 13A and 13B. The voltages at the first gate electrode, which are also composed of a high level voltage and a low level voltage, can be shifted toward positive (or negative) values from the values in the prior art shown in FIGS. 13A and 13B. This is accomplished because the device according to the present invention has the two-layer structure composed of the first and second semiconductor layers formed under the first gate electrode. Thus, the first gate electrode can be driven only with positive (or negative) voltages. In other words, in the active type photoelectric conversion device according to the present invention, the voltages at the first and second gate electrodes are controlled so as to control each pixel, and all these voltages are positive (or negative).

The second semiconductor layer located under the first gate electrode is depleted depending on an applied voltage. At the resetting, therefore, all charges accumulated under the first gate electrode can be drained by applying an appropriate voltage to deplete the second semiconductor layer, leaving no charges behind in the second semiconductor layer. Thus, the generation of after images and reset noise can be minimized.

According to the method for fabricating an active type photoelectric conversion device of the present invention, ions are implanted at low energy to form the second semiconductor layer so that the second semiconductor layer can be depleted.

According to the active type solid-state imaging device of the present invention, the clock signal voltages supplied to the driving circuit area are all positive (or negative) since the voltages applied to the first and second gate electrodes are all positive (or negative) as described above.

By using only positive (or negative) voltages for the first and second gate electrodes, both the image sensor area and the driving circuit area can be formed on a common semiconductor substrate of the first conductivity type. This not only simplifies the configuration of the semiconductor substrate but also prevents the formation of the thyristor structure.

Thus, the invention described herein makes possible the advantages of (1) providing an active type photoelectric conversion device which can be driven by positive low voltages and can sufficiently suppress the generation of after images and reset noise, (2) providing a method for fabricating such an active type photoelectric conversion device, and (3) providing an active type solid-state imaging device using such an active type photoelectric element.

These and other advantages of the present invention will become apparent to those skilled in the art upon reading and understanding the following detailed description with reference to the accompanying figures.

BRIEF DESCRIPTION OF THE DRAWINGS

FIG. 9A is a plan view of a pixel of a conventional CMD type active type photoelectric conversion device, and FIG. 9B is a sectional view taken along line 9B—9B of FIG. 9A.

DESCRIPTION OF THE PREFERRED EMBODIMENTS

First, problems arising when both positive and negative voltages are used for driving an active type photoelectric conversion device will be described.

Figure 14:
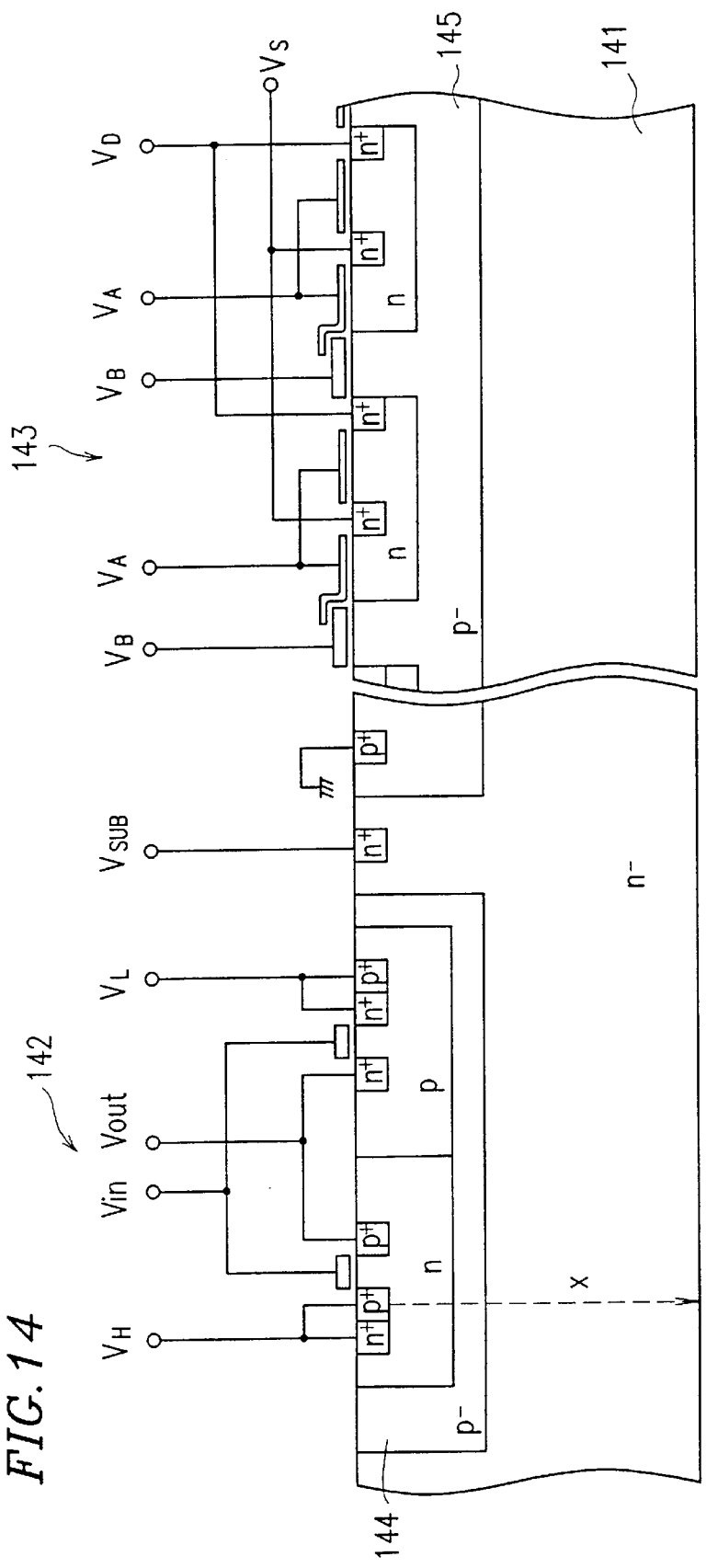
FIG. 14 is a sectional view of a semiconductor substrate having both pixels and driving circuits.

FIG. 14 shows a configuration where pixels and driving circuits for driving the pixels are formed on a common semiconductor substrate and both positive and negative driving voltages are used.

Referring to FIG. 14, an n-type semiconductor substrate 141 includes a driving circuit 142 and an image sensor area 143. The driving circuit 142 is formed on a p-type well 144 for the supply of a negative voltage. The image sensor area 143 needs to be formed on a p-type well 145 where the voltage is 0 V. The p-type wells 144 and 145 are separately formed in the surface portion of the n-type semiconductor substrate 141 providing a positive potential so that separate potentials are maintained at the p-type wells 144 and 145.

The n-type semiconductor substrate 141 with the above configuration, however, forms a thyristor structure of a PNPN junction along a dash-line arrow X in the area of the driving circuit 142 as shown in FIG. 14. This increases the risk of causing latching-up. In other words, in the TGMIS type active type photoelectric conversion device, the configuration of the semiconductor substrate is restricted because both positive and negative voltages are used for driving the device. Under this restriction, the thyristor structure tends to be formed and thus the risk of causing latching-up increases.

Figure 15:
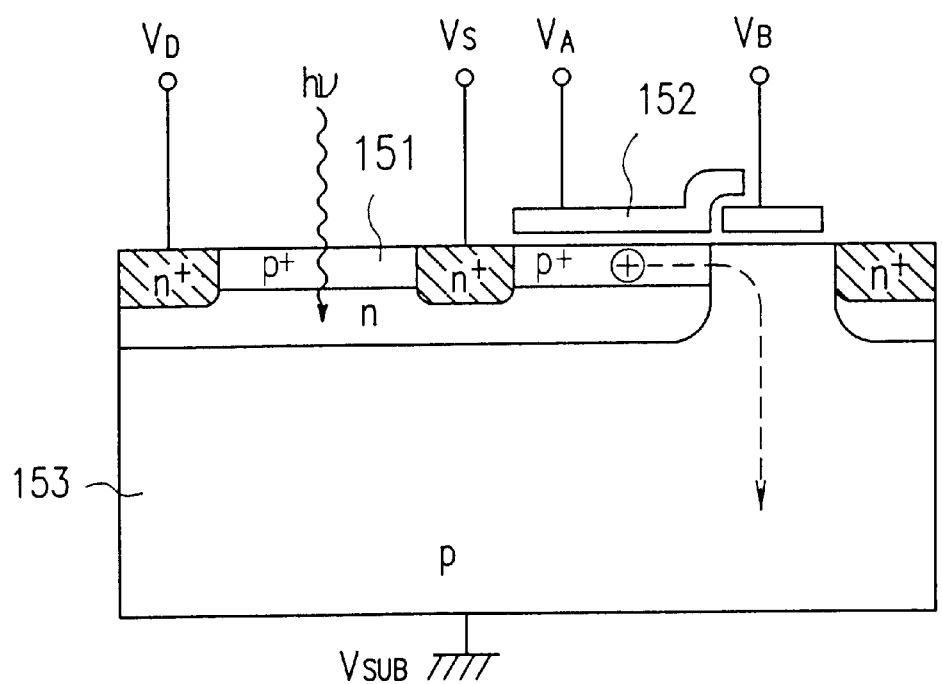
FIG. 15 is a sectional view of a pixel where a junction gate type FET is used in place of a MOSFET.

Japanese Laid-Open Publication No. 8-78653 mentioned above discloses a photoelectric conversion device as shown in FIG. 15, where a junction gate type FET is employed in each pixel in place of a MOSFET for the photoelectric conversion and amplification of signal charges in the pixel.

Referring to FIG. 15, a junction gate 151 which is a $p^+$-layer is never depleted but is always neutralized due to its high concentration. The junction gate 151 is also in a potential floating state where the potential is controlled by a gate electrode 152 to which the junction gate 151 is capacitively connected.

With this configuration, when signal charges (holes) are generated by photoelectric conversion, the signal charges are accumulated in the junction gate 151 and, at the resetting, flow into a substrate 153.

When such a junction gate type FET is used, all the driving voltages can be positive and thus the above-described thyristor structure will not be formed in the semiconductor substrate.

However, since the junction gate 151 is a highly-concentrated $p^+$-layer which is not depleted even at the resetting, leaving a number of holes in the junction gate 151. This indicates that the signal charges are not completely drained leaving part of the signal charges behind, causing incomplete transfer and the generation of after images. The failure of the depletion of the junction gate 151 also generates reset noise where the potential at the junction gate 151 varies at random due to heat resistance of a resetting channel even immediately after the resetting.

Hereinbelow, the present invention will be described by way of examples with reference to the accompanying drawings.

EXAMPLE 1

Figure 1:
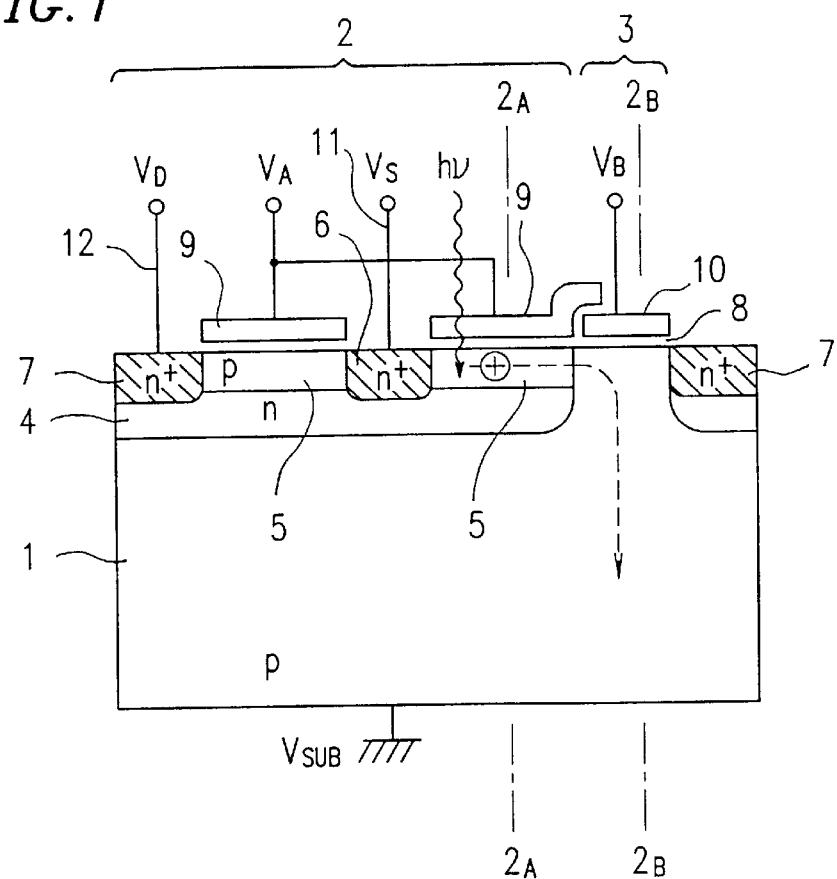
FIG. 1 is a sectional view of a pixel of an active type photoelectric conversion device according to the present invention.

FIG. 1 is a sectional view of a pixel of an active type photoelectric conversion device of Example 1 according to the present invention.

Referring to FIG. 1, a p-type (first conductivity type) semiconductor substrate 1 includes a photoelectric conversion area 2 and a gate area 3. The photoelectric conversion area 2 includes an n-type (second conductivity type) first semiconductor layer 4 and a p-type second semiconductor layer 5 which is formed so as to be in line with the surface of the semiconductor substrate 1 and depleted depending on an applied voltage. A source region 6 and a drain region 7 which are $n^+$-type diffusion layers are formed through the second semiconductor layer 5. A first gate electrode 9 is formed on the portion of the second semiconductor layer 5 where neither the source region 6 nor the drain region 7 is formed, with an insulating layer 8 therebetween.

The gate area 3 includes a second gate electrode 10 formed on the semiconductor substrate 1 with the insulating layer 8 therebetween.

The source region 6 is connected to a common source terminal 11 and the drain region 7 is connected to a common drain terminal 12.

In the above structure, light hv incident through the first gate electrode 9 generates electron-hole pairs by photoelectric conversion, and the generated electrons flow into the drain region 7. The holes are confined by a barrier formed in the middle of the first semiconductor layer 4 and a barrier formed under the second gate electrode 10, and turned into signal charges accumulated in the second semiconductor layer 5.

The potential at the first semiconductor layer 4 varies in accordance with the amount of the signal charges. This variation of the potential is detected and read as a potential variation at the source region 6 and regarded as an output signal.

At the resetting, the potential barrier under the second gate electrode 10 is reduced so as to allow the signal charges in the second semiconductor layer 5 to be drained to the semiconductor substrate 1 via a route shown by the dash-line arrow in FIG. 1.

The second semiconductor layer 5 is depleted depending on an applied voltage as described above. Accordingly, all the signal charges in the second semiconductor layer 5 can be drained to the semiconductor substrate 1 by applying an appropriate voltage to deplete the second semiconductor layer 5 at the resetting. The generation of after images and reset noise can therefore be sufficiently suppressed.

Since the p-type second semiconductor layer 5 is formed on the n-type first semiconductor layer 4, a voltage $V_A$ for driving the first gate electrode 9 can be shifted toward positive values so as to allow the first gate electrode 9 to be driven only with positive voltages, as will be described in detail later. The second gate electrode 10 is conventionally driven only with positive voltages. Thus, both the first and second gate electrodes 9 and 10 are driven only with positive voltage.

The driving of the first and second gate electrodes 9 and 10 only with positive voltages will be described.

Figure 2:
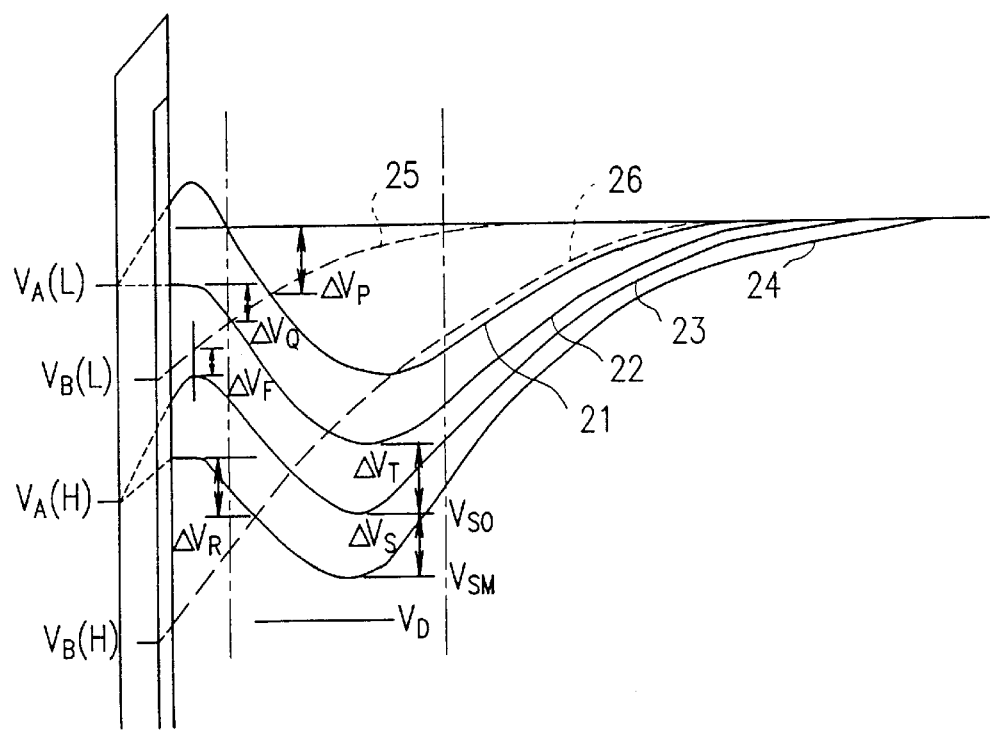
FIG. 2 shows potential distributions in the depth direction along lines $2_A$—$2_A$ and $2_B$—$2_B$ of FIG. 1.

FIG. 2 shows potential distributions in the depth direction along lines $2_A$—$2_A$ and $2_B$—$2_B$ of FIG. 1. Solid lines 21, 22, 23, and 24 represent the potential distribution obtained along line $2_A$—$2_A$, while dash lines 25 and 26 represent the potential distribution obtained along line $2_B$—$2_B$.

At the accumulation of the signal charges., a low voltage $V_A(L)$ is applied to the first gate electrode 9, while a low voltage $V_B(L)$ is applied to the second gate electrode 10. The accumulation of the signal charges (holes) in the second semiconductor layer 5 under the first gate electrode 9 varies from zero to a saturation level. With this variation, the potential distribution under the first gate electrode 9 changes from the state shown by the solid line 21 to the state shown by the solid line 22. On the contrary, the potential distribution under the second gate electrode 10 does not change, keeping the state shown by the dash line 25.

A potential difference $\Delta V_P$ between the potential value at the crossing of the solid line 21 and the dash line 25 and a surface potential at the semiconductor substrate 1 serves as a barrier for preventing charges from flowing from the semiconductor substrate 1 when no signal charge is accumulated. A potential difference $\Delta V_Q$ between the potential value at the crossing of the solid line 22 and the dash line 25 and a peak voltage at the second semiconductor layer 5 in the state shown by the solid line 22 serves as a barrier corresponding to the saturation level of the signal charges, allowing excessive signal charges to override the barrier to be drained to the semiconductor substrate 1.

At the reading of the signal charges, a voltage $V_A(H)$ higher than the voltage $V_A(L)$ is applied to the first gate electrode 9, while a voltage $V_B(H)$ higher than the voltage $V_B(L)$ is applied to the second gate electrode 10. With this change of the applied voltage to the first gate electrode 9, the potential distribution under the first gate electrode 9 changes from the state shown by the solid line 21 to the state shown by the solid line 23 if no signal charge has been accumulated under the first gate electrode 9. If the signal charges have been accumulated to the saturation level, the potential distribution under the first gate electrode 9 changes from the state shown by the solid line 22 to the state shown by the solid line 24. On the contrary, the potential distribution under the second gate electrode 10 changes from the state shown by the dash line 25 to the state shown by the dash line 26 depending on the change of the applied voltage to the second gate electrode 10.

Assume that the potential values at the bottom of the solid lines 23 and 24 are voltages $V_{SO}$ and $V_{SM}$, respectively. When a constant current load is connected to the source region 6 and a voltage $V_D$ higher than the voltage $V_{SM}$ is applied to the drain region 7, the potential at the source region 6 is either the voltage $V_{SO}$ or $V_{SM}$ depending on whether or not signal charges have been accumulated (i.e., depending on the solid line 23 or 24). Thus, an output corresponding to the amount of the signal charges can be obtained.

A potential difference $\Delta V_R$ between the potential value at the crossing of the solid line 24 and the dash line 26 and the potential at the second semiconductor layer 5 in the state shown by the solid line 24 serves as a barrier for preventing signal charges below the saturation level from flowing into the semiconductor substrate 1. A potential difference $\Delta V_T$ between the bottom of the solid lines 22 and 23 serves as a barrier which allows a current to flow only into the source region 6 of the pixel for reading, but not into the source region 6 of the pixel for accumulation when the source regions 6 of the pixel for reading and the pixel for accumulation are connected to a common source terminal.

At the resetting, the voltage $V_A(H)$ (the voltage applied at the reading) is applied to the first gate electrode 9, while the voltage $V_B(L)$ (the voltage applied at the accumulation) is applied to the second gate electrode 10. With this application, the peak potential at the second semiconductor layer 5 under the first gate electrode 9 is higher than the potential at the portion of the semiconductor substrate 1 under the second gate electrode 10 at the same depth by at least $\Delta V_F$. This allows the signal charges (holes) accumulated in the second semiconductor layer 5 under the first gate electrode 9 to be drained to the semiconductor substrate 1 via a route under the second gate electrode 10.

The potential difference $\Delta V_F$ is more than zero and represents the relationship between the potentials at the surfaces of the semiconductor substrate 1 under the first and second gate electrodes 9 and 10 (shown by the solid line 23 and the dash line 25) required for complete drainage of the signal charges at the resetting.

Figure 13A:
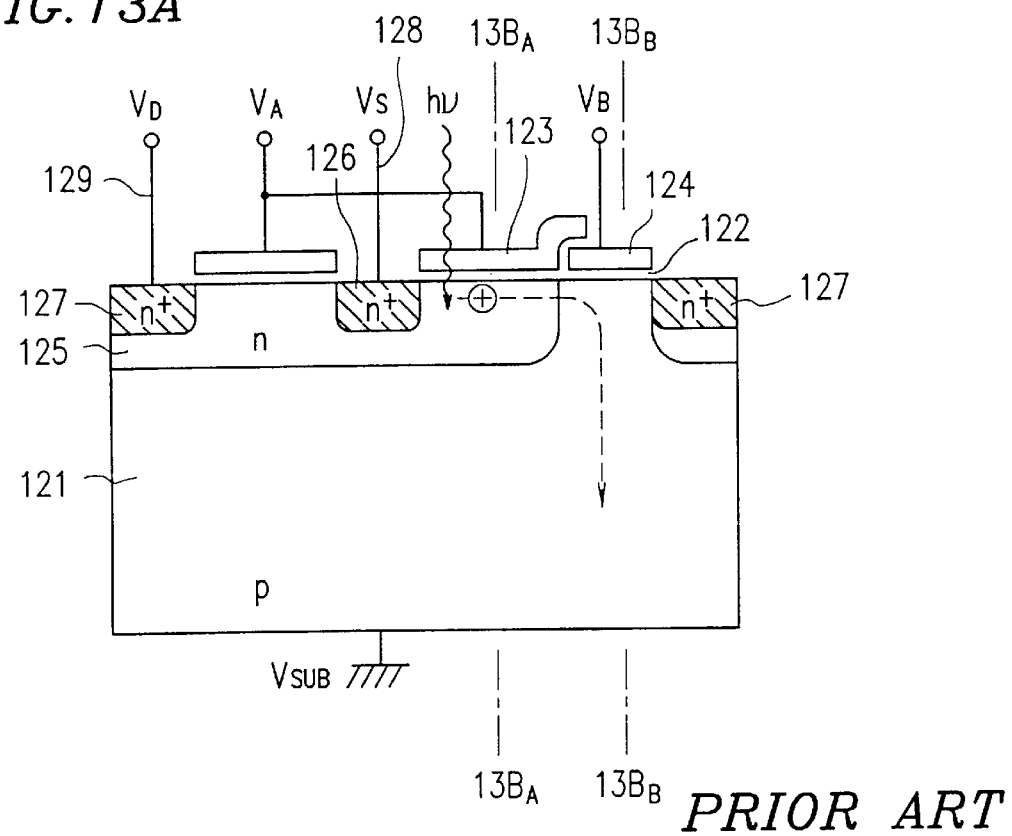
FIG. 13A is a sectional view of a pixel of a conventional TGMIS type active type photoelectric conversion device.
Figure 13B:
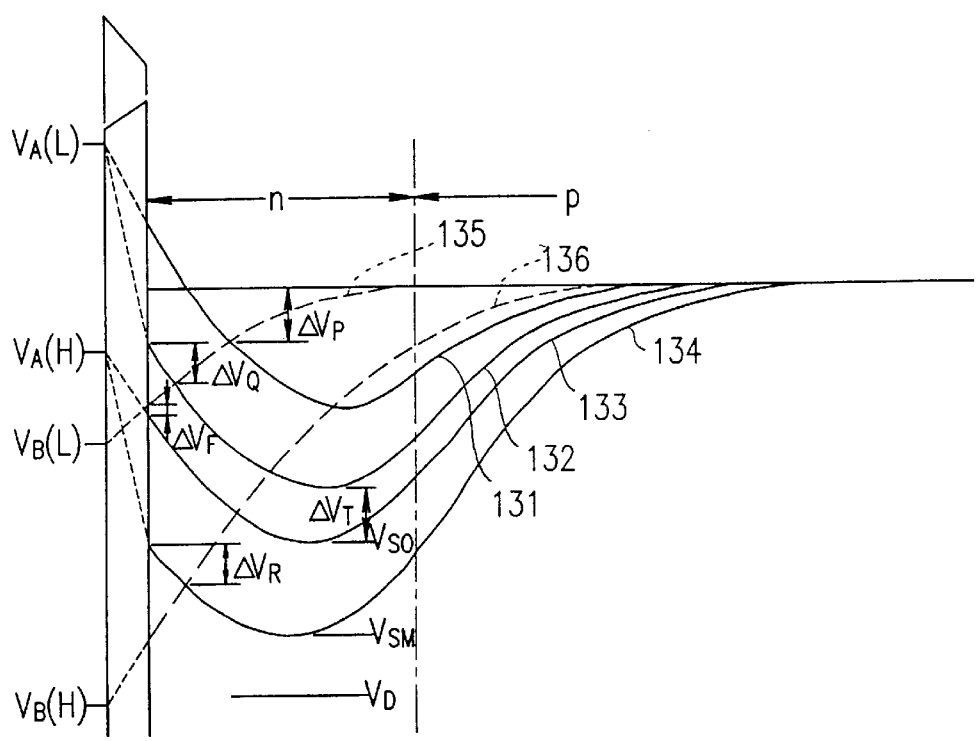
FIG. 13B shows potential distributions in the depth direction along lines $13B_A$—$13B_A$ and $13B_B$—$13B_B$ of FIG. 13A.

As is apparent from FIG. 2, the solid lines 21 to 24 representing the potential distribution under the first gate electrode 9 are curved into positive values in the region of the second semiconductor layer 5. As a result, the voltages $V_A(L)$ and $V_A(H)$ applied to the first gate electrode 9 are shifted toward positive values compared with the voltages $V_A(L)$ and $V_A(H)$ shown in FIG. 13B as prior art. In particular, the voltage $V_A(L)$ is shifted from the negative value to the positive value. The other voltages $V_B(L)$ and $V_B(H)$ are positive as in the prior art. As a result, both the first and second gate electrodes 9 and 10 can be driven only with positive voltages.

For the quantitative representation of the active type photoelectric conversion device of Example 1, Condition 2 as follows is assumed.

[Condition 2]
Impurity concentration of substrate: $N_B=0.8\times 10^{15}$ cm$^{-3}$
Impurity concentration of n-layer: $N_N=4.0\times 10^{15}$ cm$^{-3}$
Impurity concentration of p-layer: $N_P=2.0\times 10^{16}$ cm$^{-3}$
Thickness of n-layer: $d_N=1.2$ μm
Thickness of p-layer: $d_P=0.3$ μm
Thickness of oxide insulating film (in gate area 3): $d_{o1}=30$ nm
Thickness of oxide insulating film (in photoelectric conversion area 2): $d_{o2}=100$ nm
Amount of signal charges at saturation level: $Q_{SAT}=2.75\times 10^{11}$ cm$^{-2}$
Material of first and second gate electrodes 9 and 10: n$^+$-doped polysilicon film In Condition 2, the impurity concentration of substrate, the thickness of oxide insulating film, and the amount of signal charges at saturation level are changed from those in Condition 1 in the prior art merely for easier description of the conditions. These values will by no means restrict the present invention.

The voltages shown in FIG. 2 are set as follows:
$V_A(L)=0.0$ V, $V_A(H)=3.0$ V
$V_B(L)=1.3$ V, $V_B(H)=5.0$ V
$\Delta V_P=0.94$ V
$\Delta V_Q=0.50$ V
$\Delta V_R=0.61$ V
$\Delta V_T=0.91$ V
$\Delta V_F=0.46$ V The voltage difference $\Delta V_P$ should be preferably about 0.8 V or more for preventing charges from flowing in. The voltage difference $\Delta V_Q$ should be preferably about 0.5 V or less for allowing excessive charges to be drained. The voltage difference $\Delta V_T$ should be preferably 0.7 V or more for distinguishing the ON-OFF characteristics of pixels for reading and pixels for accumulation. The voltage difference $\Delta V_F$ requires to be 0.0 V or more where no barrier is formed. The above values for $\Delta V_P$, $\Delta V_Q$, $\Delta V_R$, $\Delta V_T$, $\Delta V_F$ are therefore within the preferable ranges.

When the maximum amplitude of a reading signal is a potential difference $\Delta V_S$ between the voltages $V_{SO}$ and $V_{SM}$, which is 0.90 V, a sufficient signal amplitude can be obtained.

Now, referring to FIGS. 3A to 3D, a method for fabricating the active type photoelectric conversion device of Example 1 will be described.

Figure 3A:
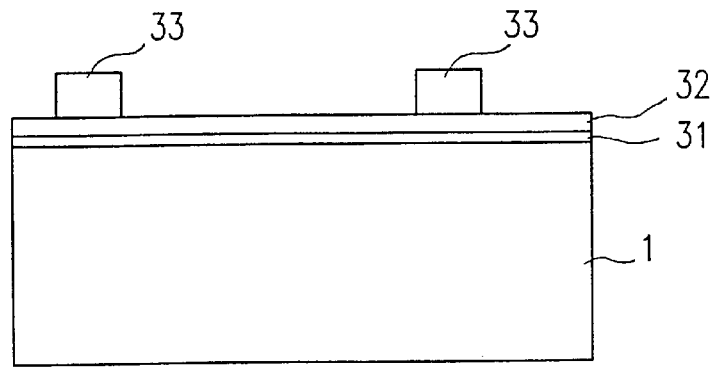
FIGS. 3A to 3D are sectional views of the device shown in FIG. 1, illustrating the steps of (A) forming a second gate electrode, (B) forming first and second semiconductor layers, (C) forming a first gate electrode, and (D) forming a source region and a drain region.

As shown in FIG. 3A, an insulating film 31 is formed on the p-type semiconductor substrate 1, and an electrode layer 32 made of polysilicon doped with impurities such as phosphorus at a high concentration is formed on the insulating film 31. The electrode layer 32 is patterned using a photoresist layer 33 as a mask to form the second gate electrodes 10 (FIG. 3B).

Figure 3B:
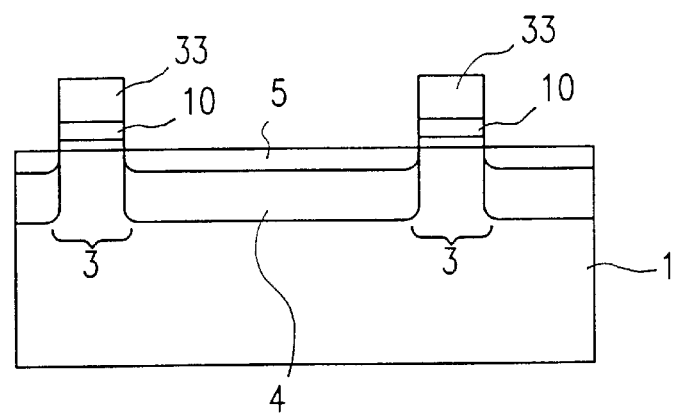

As shown in FIG. 3B, using the second gate electrodes 10 and the photoresist layer 33 as a mask, ion implantation is performed at a high energy of about 500 KeV to 3 MeV (typically, 1 MeV) to form the first semiconductor layers 4, and is performed at a low energy of 20 KeV to 100 KeV (typically, 50 KeV) to form the second semiconductor layers 5. Thus, the first and second semiconductor layers 4 and 5 are formed so as to be adjacent to the gate areas 3 including the second gate electrodes 10 so that the interfaces of the first and second semiconductor layers 4 and 5 with the gate areas 3 are aligned with each other. Since the p-type impurity concentration of the second semiconductor layer 5 is low ($N_P$: about $2.0\times 10^{16}$ cm$^{-3}$), the second semiconductor layer 5 can be depleted depending on an applied voltage as described above.

Figure 3C:
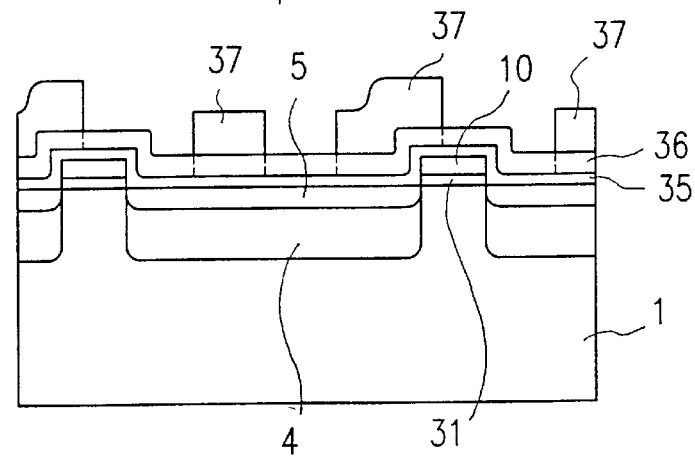

As shown in FIG. 3C, the photoresist layer 33 is removed, and an insulating film 35 is formed over the resultant surface. An electrode layer 36 made of polysilicon doped with impurities such as phosphorus at a high concentration is formed on the insulating film 35. The electrode layer 36 is patterned using a photoresist layer 37 as a mask to form the first gate electrodes 9 (FIG. 3D).

The thickness of the insulating film 35 is not necessarily the same as that of the insulating film 31. That is, the thicknesses of the insulating films in the photoelectric conversion area 2 and the gate area 3 may be different from each other as shown in Condition 2.

Figure 3D:
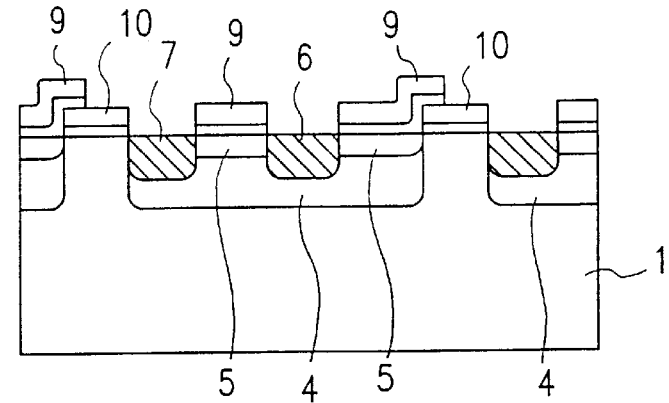

As shown in FIG. 3D, impurities such as arsenic are implanted at a high concentration using the first and second gate electrodes 9 and 10 as a mask to form the source regions 6 and the drain regions 7.

The subsequent process is omitted as it is the same as that of a general method for fabricating MOSFETs.

In the above fabrication method in this example, both the first and second semiconductor layers 4 and 5 were formed by the ion implantation using the second gate electrodes 10 and the photoresist layer 33 as a mask as shown in FIG. 3B. The first and second semiconductor layers 4 and 5 may also be formed in any other procedure.

For example, only the first semiconductor layers 4 may be formed by ion implantation at high energy using the second gate electrodes 10 and the photoresist layer 33 as a mask. Then, the second semiconductor layers 5 may be formed after the photoresist layer 33 is removed and the insulating film 35 is formed at the step shown in FIG. 3C. In this case, since ion implantation for the second semiconductor layers 5 is performed after the formation of the insulating film 35, a heating process to be performed after the ion implantation can be reduced. This provides an advantage of suppressing the diffusion of ions implanted in the second semiconductor layers 5 in a lateral direction. Also, as indicated in Condition 2, the p-type impurity concentration of the second semiconductor layers 5 ($N_P$=2.0×10$^{16}$ cm$^{-3}$) is significantly low compared with the impurity concentration of the source and drain regions 6 and 7 and that of the n$^+$-doped polysilicon for the first and second gate electrodes 9 and 10 (generally, 10$^{16}$ cm$^{-3}$ or more). Therefore, the ion implantation for the second semiconductor layers 5 does not affect these regions and electrodes.

EXAMPLE 2

Figure 4:
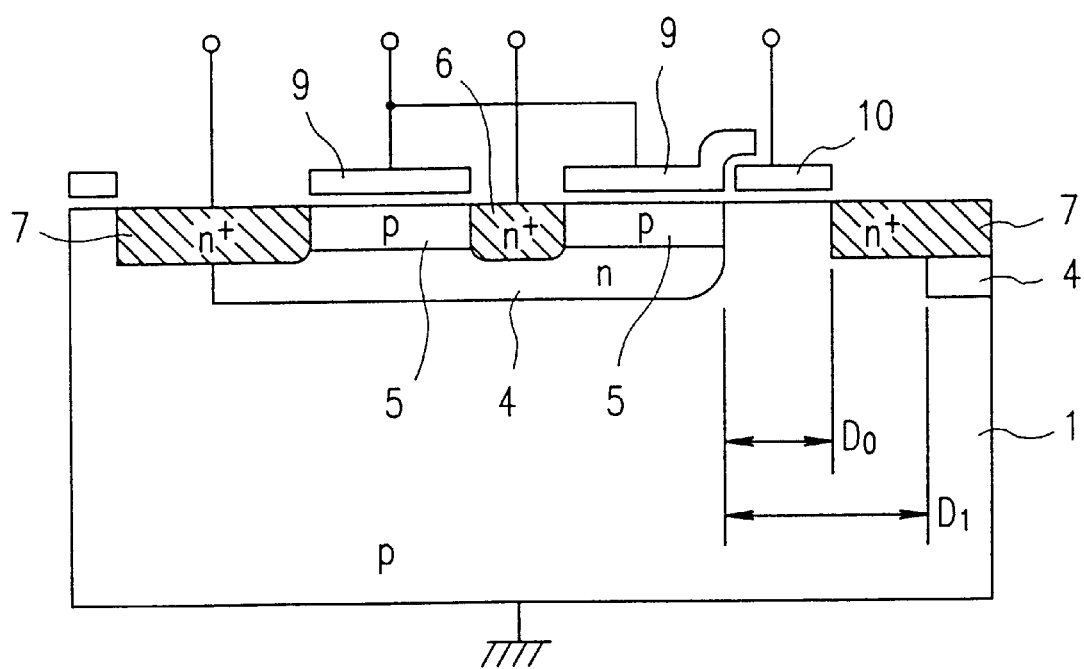
FIG. 4 is a sectional view of a pixel of another active type photoelectric conversion device according to the present invention.

FIG. 4 is a sectional view of a pixel of an active type photoelectric conversion device of Example 2 according to the present invention. Components similar to those shown in FIG. 1 are denoted by the same reference numerals, and the description thereof is omitted here.

In Example 2, each second gate electrode 10 is etched on the right side as is seen in the figure after the formation of the first and second semiconductor layers 4 and 5 so that the second gate electrode 10 is apart from the left end of the right-side first semiconductor layer 4. This expands the width of the drain route of the signal charges (holes) from $D_0$ to $D_1$ and thus reduces the potential shift caused by a two dimensional effect of potential from the n-type first semiconductor layer 4. As a result, the signal charges are more readily drained to the semiconductor substrate 1. Referring to FIGS. 5A to 5E, a method for fabricating the active type photoelectric conversion device of Example 2 will be described.

Figure 5A:
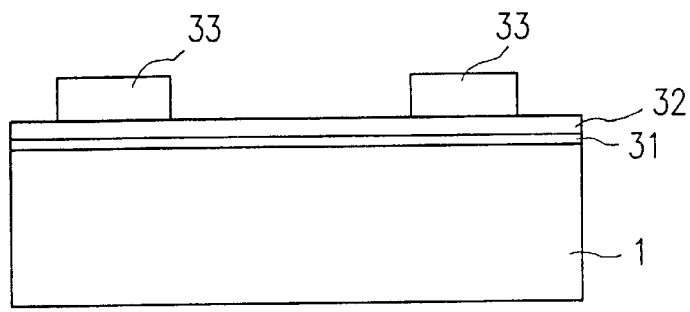
FIGS. 5A to 5E are sectional views of the device shown in FIG. 4, illustrating the steps of (A) forming a second gate electrode, (B) forming first and second semiconductor layers, (C) patterning the second gate electrode, (D) forming a first gate electrode, and (E) forming a source region and a drain region.

As shown in FIG. 5A, an insulating film 31 is formed on the p-type semiconductor substrate 1, and an electrode layer 32 made of polysilicon doped with impurities such as phosphorus at a high concentration is formed on the insulating film 31. The electrode layer 32 is patterned using a photoresist layer 33 as a mask to form electrode layers 32' (FIG. 5B) for forming the second gate electrodes 10.

Figure 5B:
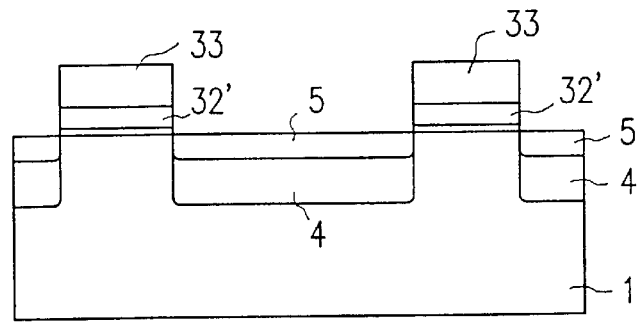

As shown in FIG. 5B, using the electrode layers 32' and the photoresist layer 33 as a mask, ion implantation is performed at high energy and at low energy to form the first semiconductor layers 4 and the second semiconductor layers 5, respectively.

Figure 5C:
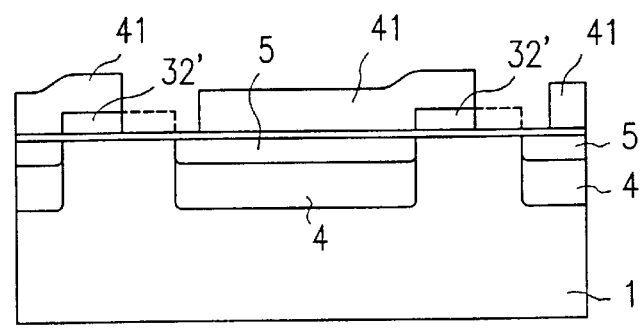

As shown in FIG. 5C, the photoresist layer 33 is removed, and another photoresist layer 41 is formed. The electrode layers 32' are further patterned using the photoresist layer 41 as a mask to etch the right ends of the respective electrode layers 32', thus forming the second gate electrodes 10 (FIG. 5D).

Figure 5D:
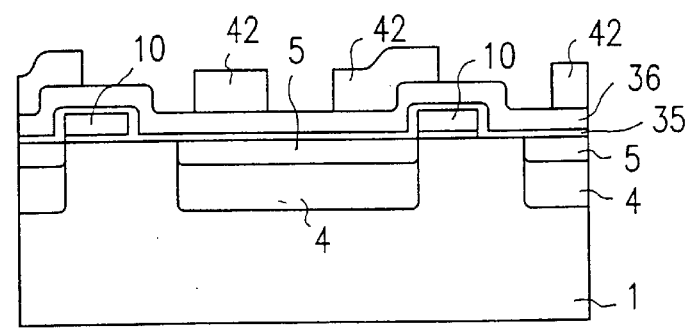

As shown in FIG. 5D, the photoresist layer 41 is removed, and an insulating film 35 is formed over the resultant surface. An electrode layer 36 made of polysilicon doped with impurities such as phosphorus at a high concentration is formed on the insulating film 35. The electrode layer 36 is patterned using a photoresist layer 42 as a mask to form the first gate electrodes 9 (FIG. 5E).

Figure 5E:
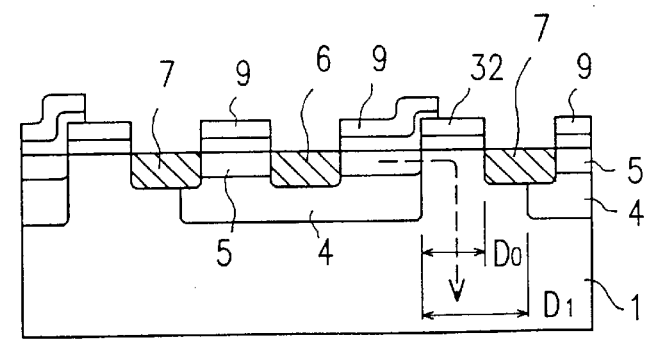

As shown in FIG. 5E, impurities such as arsenic are implanted at a high concentration using the first and second gate electrodes 9 and 10 as a mask to form the source regions 6 and the drain regions 7.

In the above fabrication method, both the first and second semiconductor layers 4 and 5 were formed by the ion implantation using the electrode layers 32' and the photoresist layer 33 as a mask as shown in FIG. 5B. The first and second semiconductor layers 4 and 5 may also be formed in any other procedure.

For example, only the first semiconductor layers 4 may be formed by ion implantation at high energy using the electrode layers 32' and the photoresist layer 33 as a mask. Then, the second semiconductor layers 5 may be formed by ion implantation at low energy after the formation of the insulating film 35 at the step shown in FIG. 5D. Then, the first gate electrodes 9 may be formed.

EXAMPLE 3

Figure 6:
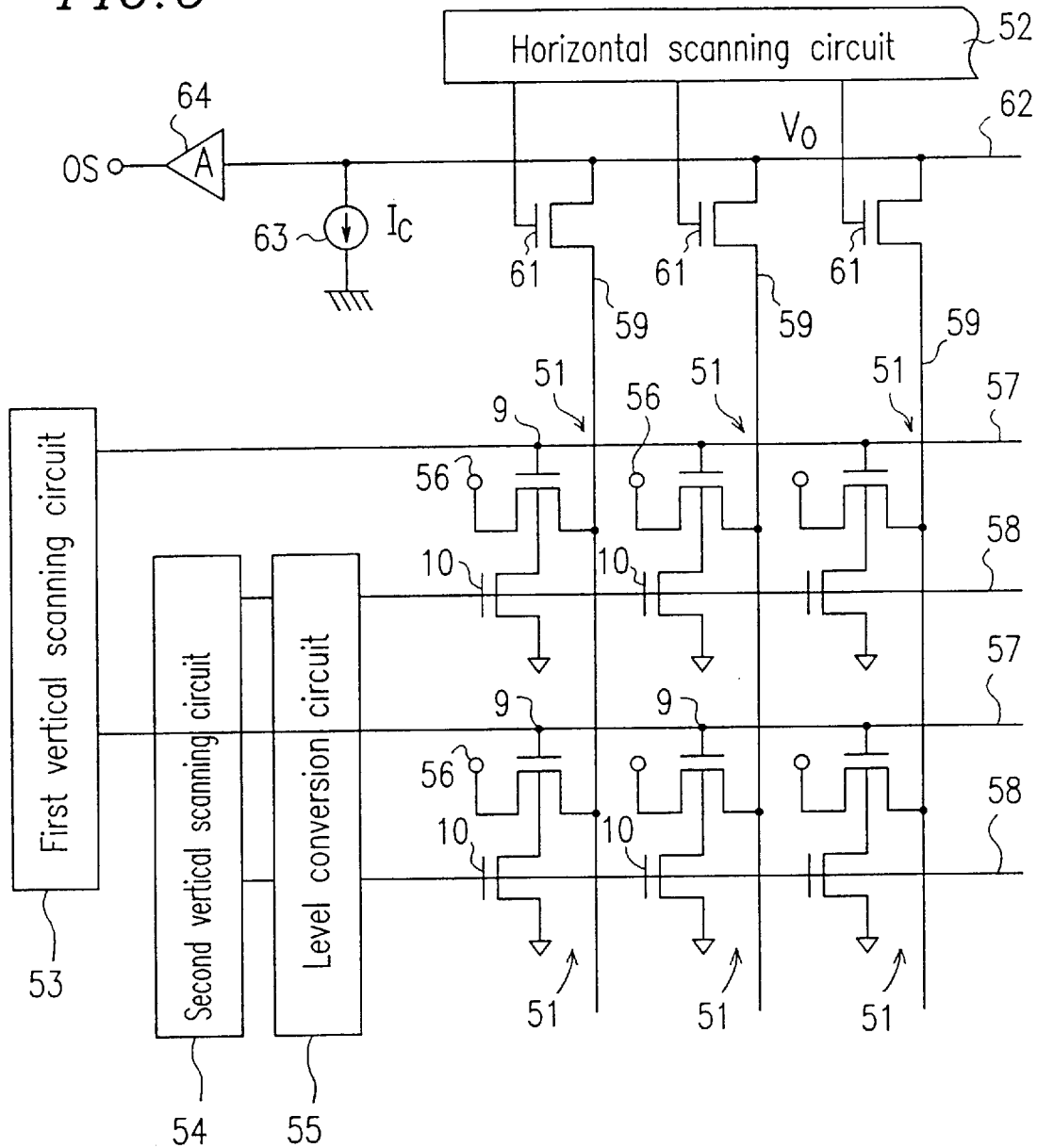
FIG. 6 is a block diagram showing an active type solid-state imaging device according to the present invention.

FIG. 6 is a block diagram of an active type solid-state imaging device of Example 3 according to the present invention.

The sold-state imaging device of this example includes a plurality of pixels 51 shown in FIG. 1 arranged in a matrix and a horizontal scanning circuit 52, first and second vertical scanning circuits 53 and 54, and a level conversion circuit 55 provided for driving and controlling the pixels 51.

A DC voltage $V_D$ is applied to a drain 56 (corresponding to the drain region 7 in FIG. 1) of each pixel 51.

The first gate electrodes 9 of the pixels 51 lined in each horizontal row are commonly connected to a horizontal first clock line 57, which is in turn connected to the first vertical scanning circuit 53. The first vertical scanning circuit 53 sequentially selects each horizontal row to control the reading operation of the corresponding pixels 51.

The second gate electrodes 10 of the pixels 51 lined in each horizontal row are commonly connected to a horizontal second clock line 58, which is in turn connected to the second vertical scanning circuit 54. The second vertical scanning circuit 54 sequentially selects each horizontal row to control the resetting operation of the corresponding pixels 51.

Sources (corresponding to the source regions 6 in FIG. 1) of the pixels 51 lined in a vertical column are commonly connected to a vertical signal line 59, which is in turn connected to the horizontal scanning circuit 52 via a corresponding transistor 61. The horizontal scanning circuit 52 sequentially selects the transistor 61 of each vertical column to turn on.

The transistors 61 are also connected to a common signal line 62. The common signal line 62 is grounded via a transistor 63 inserted to provide a constant current load and also connected to a buffer amplifier 64.

The signal charges accumulated in the pixels 51 lined in each horizontal row are read by the driving control by the horizontal scanning circuit 52 and the first and second vertical scanning circuits 53 and 54. The resultant signals are sent to the common signal line 62 and output from the buffer amplifier 64.

The first vertical scanning circuit 53, which is connected to the first gate electrodes 9 of the pixels 51, selectively outputs the voltages $V_A(L)$ and $V_A(H)$. The second vertical scanning circuit 54, which is connected to the second gate electrodes 10 of the pixels 51, selectively outputs the voltages $V_B(L)$ and $V_B(H)$. Four different voltages are therefore required.

For example, four different voltages can be provided in the following manner. Since $V_A(L)$=0.0 V, $V_A(H)$=3.0 V, $V_B(L)$=1.3 V, and $V_B(H)$=5.0 V as described above, clock signals $\phi_A$ and $\phi_B$ each having a low level of 0.0 V and a high level of 3.0 V are formed by the first and second vertical scanning circuits 53 and 54, respectively. The clock signal $\phi_A$ is supplied to the first gate electrodes 9 without any conversion to provide the voltages $V_A(L)$ and $V_A(H)$. The clock signal $\phi_B$ is sent to the level conversion circuit 55 to convert the signal into a clock signal $\phi_B'$ having a low level of 1.3 V and a high level of 5.0 V to provide the voltages $V_B(L)$ and $V_B(H)$.

Figure 7:
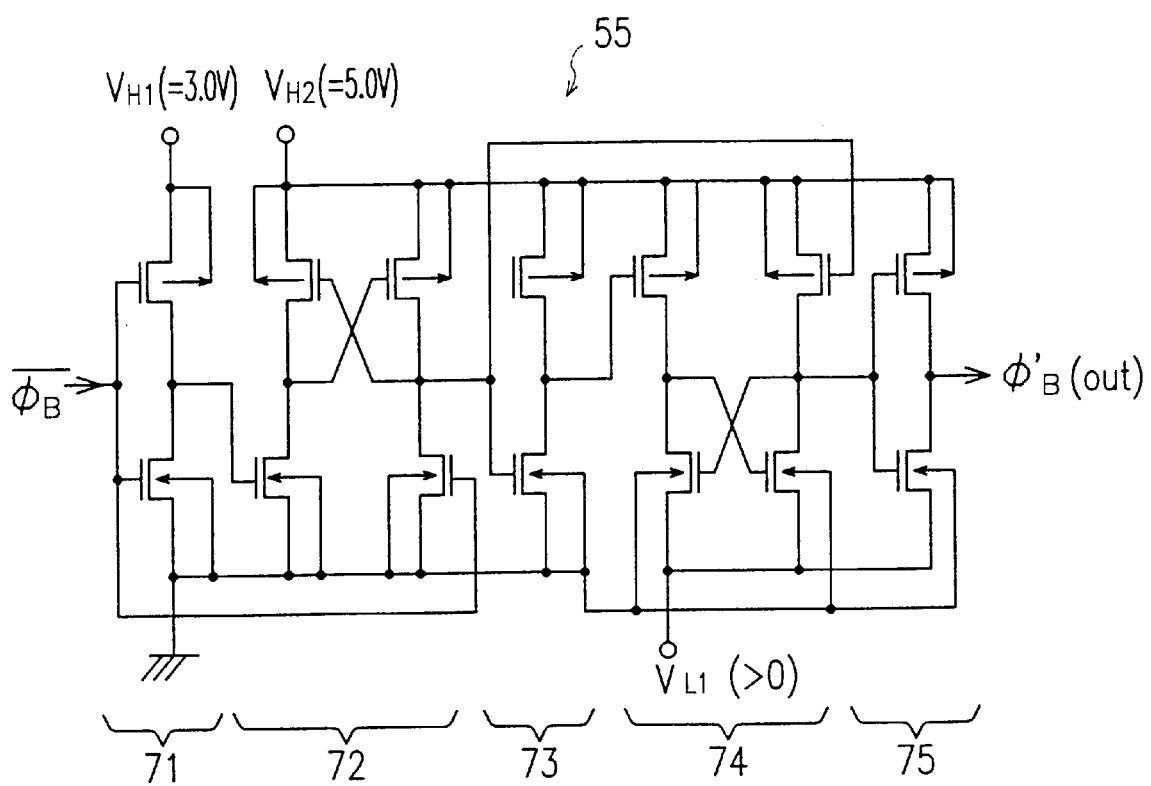
FIG. 7 is a circuit diagram showing a level conversion circuit of the device shown in FIG. 6.

FIG. 7 shows a circuit configuration of the level conversion circuit 55. Power voltages $V_{H1}$, $V_{H2}$, and $V_{L1}$ in the level conversion circuit 55 are assumed to be 3.0 V, 5.0 V, and 1.3 V, respectively.

In the level conversion circuit 55, an inverted signal $\phi_B$ bar of the clock signal $\phi_B$ is input into a first inverter 71, where the inverted signal $\phi_B$ bar is inverted and sent to a first voltage converter 72. The first voltage converter 72 converts the high level voltage $V_{H1}=3.0$ V of this signal into the power voltage $V_{H2}=5.0$ V, and sends a signal having a low level of 0.0 V and a high level of 5.0 V to a second inverter 73. The second inverter 73 inverts the signal and sends the inverted signal to a second voltage converter 74. The second voltage converter 74 converts the low level of this signal, 0.0 V, into the power voltage $V_{L1}=1.3$ V, and sends a signal having a low level of 1.3 V and a high level of 5.0 V to a third inverter 75. The third inverter 75 inverts the signal and output as the clock signal $\phi_B'$.

Figure 8:
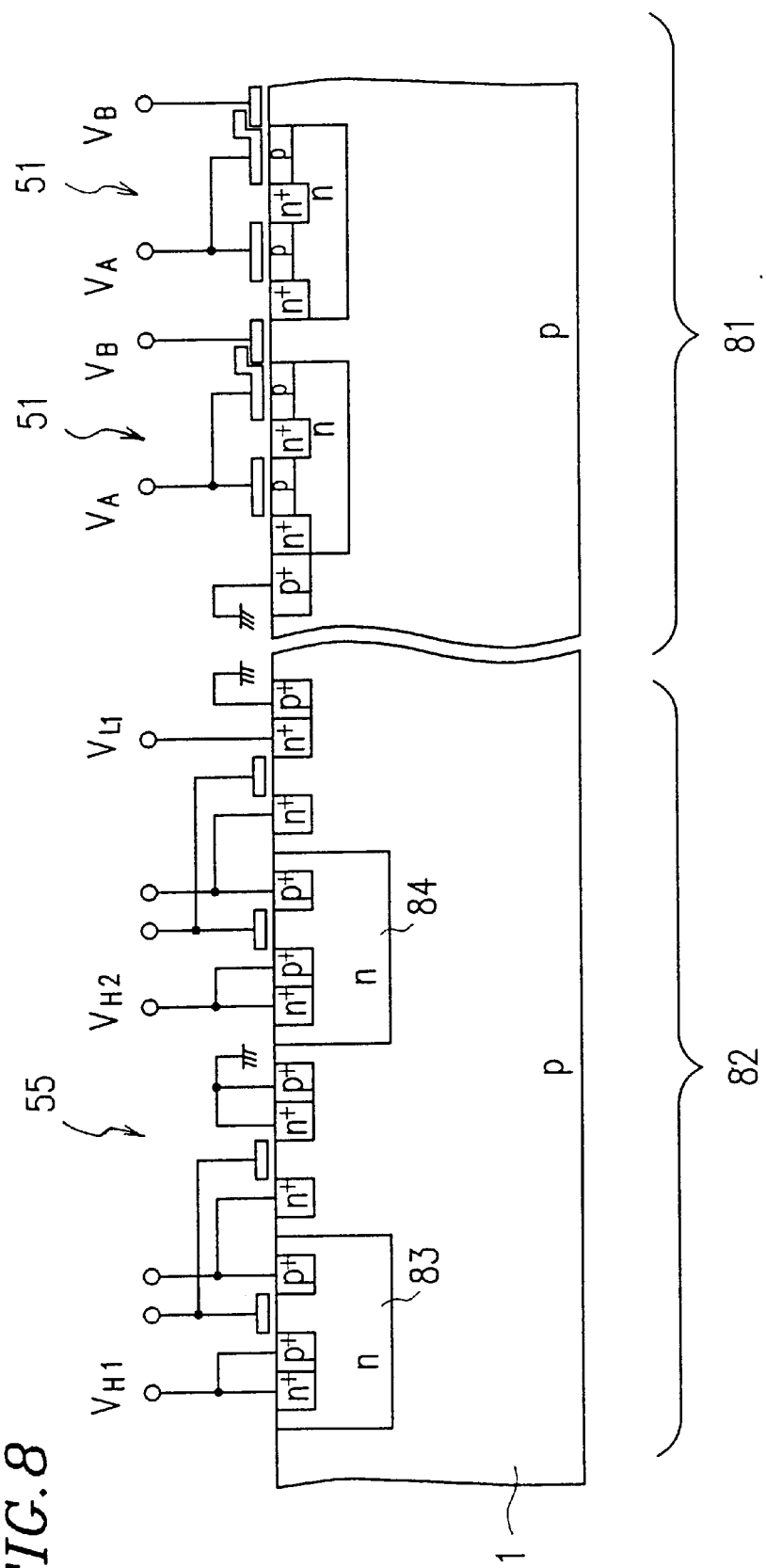
FIG. 8 is a sectional view schematically showing a semiconductor substrate having an image sensor area composed of an array of a plurality of pixels shown in FIG. 1 and a driving circuit area including the level conversion circuit shown in FIG. 7.
Figure 10:
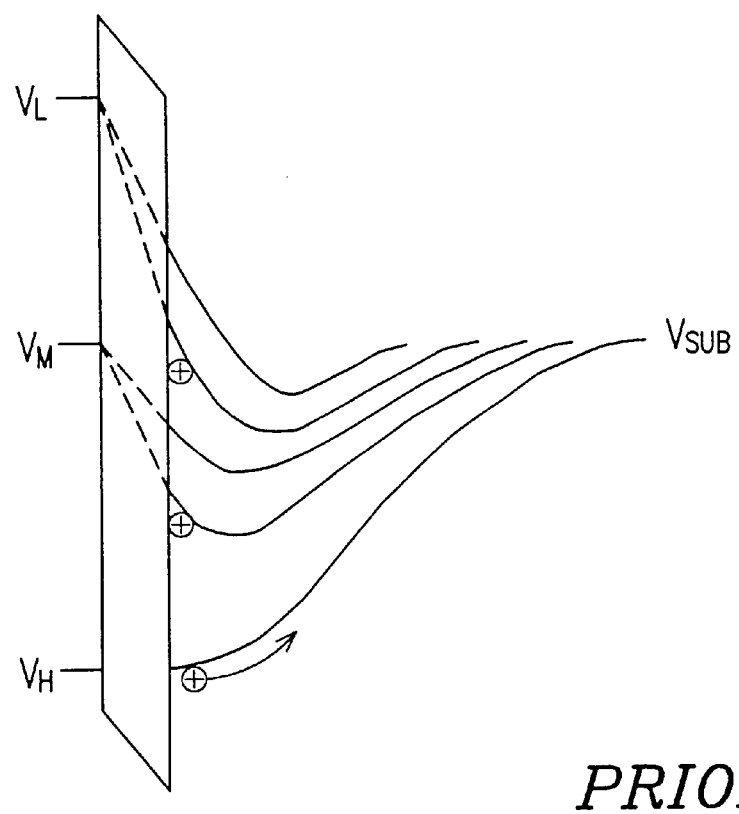
FIG. 10 shows a potential distribution in the depth direction along line 10—10 of FIG. 9B.
Figure 11A:
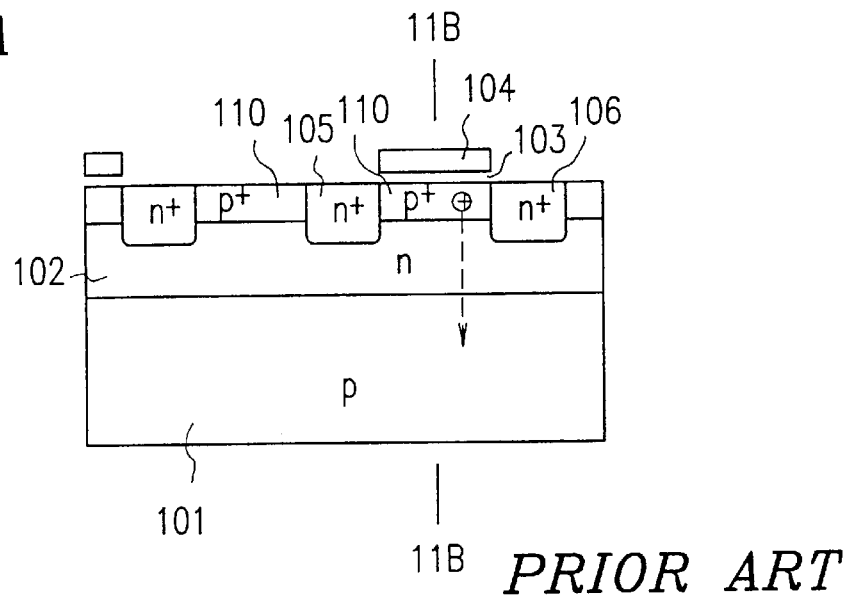
FIG. 11A is a sectional view of a pixel of a conventional FGA type active type photoelectric conversion device.
Figure 11B:
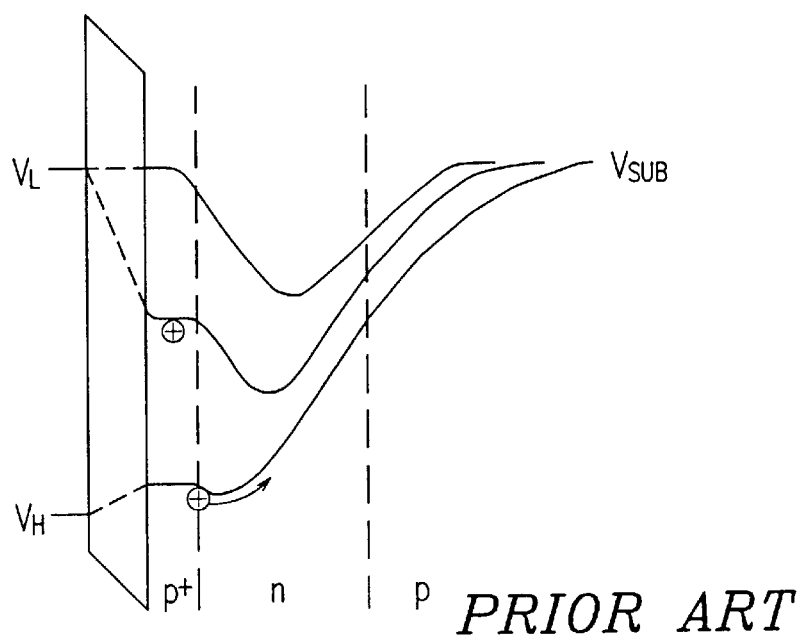
FIG. 11B shows a potential distribution in the depth direction along line 11B—11B of FIG. 11A.
Figure 12A:
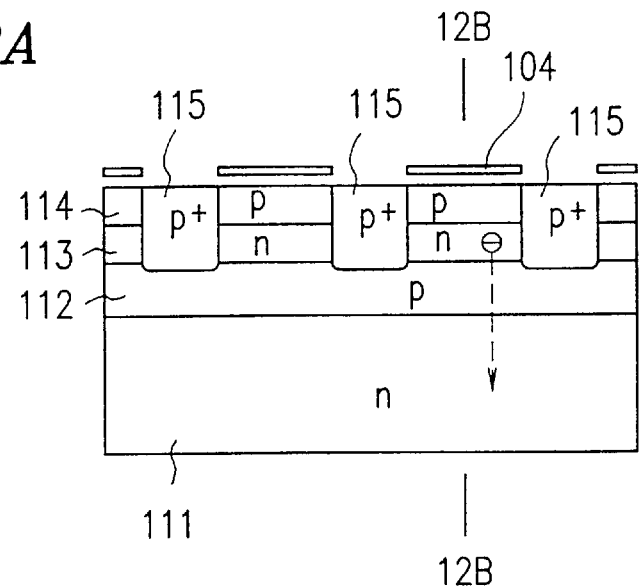
FIG. 12A is a sectional view of a pixel of a conventional BCMD type active type photoelectric conversion device.
Figure 12B:
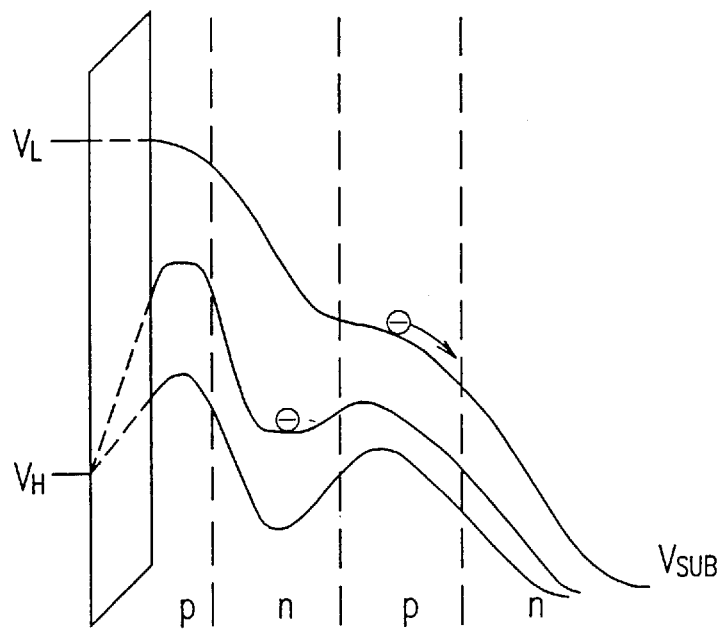
FIG. 12B shows a potential distribution in the depth direction along line 12B—12B of FIG. 12A.

FIG. 8 schematically shows a semiconductor substrate where the level conversion circuit 55, the pixels 51, and the like are formed. Components similar to those of the active type photoelectric conversion device shown in FIG. 1 are denoted by the same reference numerals, and the description thereof is omitted here.

Referring to FIG. 8, the p-type semiconductor substrate 1 includes an image sensor area 81 composed of an array of the pixels 51 and a driving circuit area 82 composed of the level conversion circuit 55 (together with the horizontal scanning circuit 52, the first and second vertical scanning circuits 53 and 54, and the like though they are not shown in this figure).

Since the semiconductor substrate is at the ground potential, two n-type semiconductor layers 83 and 84 are formed in the driving circuit area 82 to form the first inverter 71 and the first voltage converter 72, respectively, so that the high level power voltages $V_{H1}$ and $V_{H2}$ (3.0 V and 5.0 V) can be used.

In the level conversion circuit 55, not only grounded transistors but also transistors connected to the low level voltage $V_{L1}=1.3$ V can be directly formed on the semiconductor substrate 1.

As is apparent from FIG. 8, both the image sensor area 81 and the driving circuit area 82 are simple in configuration. The thyristor structure is not formed anywhere in the semiconductor substrate 1, and thus there is no risk of causing latching-up.

The present invention is not restricted to the above examples, but various modifications are possible. For example, various known materials may be appropriately combined to form the active type photoelectric conversion device and the active type solid-state imaging device according to the present invention. Also, various known techniques may be appropriately combined to implement the method for fabricating the active type photoelectric conversion device according to the present invention. The level conversion circuit 55 may be omitted as desired.

Thus, the active type photoelectric conversion device according to the present invention includes the first and second gate electrodes in each pixel. The double-layer structure composed of the first and second semiconductor layers is formed in the surface portion of the semiconductor substrate under the first gate electrode. This allows for the driving of the first gate electrode with positive voltages. Thus, all the voltages applied to the first and second gate electrodes for the control of the pixel are positive.

The second semiconductor layer formed under the first gate electrode is depleted depending on an applied voltage. Accordingly, at the resetting, all signal charges in the second semiconductor layer under the first gate electrode can be drained to the semiconductor substrate by applying an appropriate voltage to deplete the second semiconductor layer, leaving no charges behind in the second semiconductor layer. The generation of after images and reset noise can therefore be sufficiently suppressed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An active type photoelectric conversion device including a pixel having a photoelectric conversion area and a gate area which are formed in a surface portion of a semiconductor substrate of a first conductivity type, the photoelectric conversion area comprising:
    a first semiconductor layer of a second conductivity type formed in the surface portion of the semiconductor substrate;
    a second semiconductor layer of the first conductivity type formed on the first semiconductor layer; and
    a FET including a drain and a source of the second conductivity type formed from the surface of the semiconductor substrate through the second semiconductor layer and a first gate electrode formed on the second semiconductor layer with an insulating layer therebetween, the FET generating signal charges by photoelectric conversion of light incident on the semiconductor substrate through the first gate electrode and the insulating layer, accumulating the signal charges in the second semiconductor layer, and generating an output signal corresponding to the signal charges, the gate area comprising:
    a second gate electrode formed on the semiconductor substrate with an insulating layer therebetween, the second gate electrode allowing the signal charges accumulated in the second semiconductor layer in the photoelectric conversion area to flow toward the semiconductor substrate in accordance with an applied voltage to the second semiconductor layer,
    wherein the second semiconductor layer of the first conductivity type is depleted depending on the applied voltage.

2. A method for fabricating an active type photoelectric conversion device, the active type photoelectric conversion device including a pixel having a photoelectric conversion area and a gate area which are formed in a surface portion of a semiconductor substrate of a first conductivity type, the photoelectric conversion area comprising: a first semiconductor layer of a second conductivity type formed in the surface portion of the semiconductor substrate; a second semiconductor layer of the first conductivity type formed on the first semiconductor layer; and a FET including a drain and a source of the second conductivity type formed from the surface of the semiconductor substrate through the second semiconductor layer and a first gate electrode formed on the second semiconductor layer with an insulating layer therebetween, the FET generating signal charges by photoelectric conversion of light incident on the semiconductor substrate through the first gate electrode and the insulating layer, accumulating the signal charges in the second semiconductor layer, and generating an output signal corresponding to the signal charges, the gate area comprising: a second gate electrode formed on the semiconductor substrate with an insulating layer therebetween, the second gate electrode allowing the signal charges accumulated in the second semiconductor layer in the photoelectric conversion area to flow toward the semiconductor substrate in accordance with an applied voltage to the second semiconductor layer, wherein the second semiconductor layer of the first conductivity type is depleted depending on the applied voltage, the method comprising the steps of:

forming a first electrode layer on the semiconductor substrate of the first conductivity type with a first insulating layer therebetween and patterning the first electrode layer using a resist to form the second gate electrode;

implanting ions in the semiconductor substrate at high energy using the second gate electrode and the resist as a mask to form the first semiconductor layer of the second conductivity type;

implanting ions in the semiconductor substrate at low energy using at least the second gate electrode as a mask to form the second semiconductor layer of the first conductivity type; and forming a second electrode layer on the resultant surface with a second insulating layer therebetween and patterning the second electrode layer using a resist to form the first gate electrode.

3. A method for fabricating an active type photoelectric conversion device, the active type photoelectric conversion device including a pixel having a photoelectric conversion area and a gate area which are formed in a surface portion of a semiconductor substrate of a first conductivity type, the photoelectric conversion area comprising: a first semiconductor layer of a second conductivity type formed in the surface portion of the semiconductor substrate; a second semiconductor layer of the first conductivity type formed on the first semiconductor layer; and a FET including a drain and a source of the second conductivity type formed from the surface of the semiconductor substrate through the second semiconductor layer and a first gate electrode formed on the second semiconductor layer with an insulating layer therebetween, the FET generating signal charges by photoelectric conversion of light incident on the semiconductor substrate through the first gate electrode and the insulating layer, accumulating the signal charges in the second semiconductor layer, and generating an output signal corresponding to the signal charges, the gate area comprising: a second gate electrode formed on the semiconductor substrate with an insulating layer therebetween, the second gate electrode allowing the signal charges accumulated in the second semiconductor layer in the photoelectric conversion area to flow toward the semiconductor substrate in accordance with an applied voltage to the second semiconductor layer, wherein the second semiconductor layer of the first conductivity type is depleted depending on the applied voltage, the method comprising the steps of:

forming a first electrode layer on the semiconductor substrate of the first conductivity type with a first insulating layer therebetween and patterning the first electrode layer using a resist to form the second gate electrode;

implanting ions in the semiconductor substrate at high energy using the second gate electrode and the resist as a mask to form the first semiconductor layer of the second conductivity type;

forming a second insulating layer on the second gate electrode after removing the resist;

implanting ions in the semiconductor substrate at low energy using the second gate electrode as a mask to form the second semiconductor layer of the first conductivity type; and forming a second electrode layer on the second insulating layer and patterning the second electrode layer using a resist to form the first gate electrode.

4. An active type solid-state imaging device including an image sensor area having a plurality of active type photoelectric conversion devices arranged in a matrix and a driving circuit area for driving the plurality of active type photoelectric conversion devices, the driving circuit area comprising:

a horizontal scanning circuit for horizontally scanning the plurality of active type photoelectric conversion devices for signal reading; and a vertical scanning circuit for vertically scanning the plurality of active type photoelectric conversion devices for signal reading, each of the plurality of active type photoelectric conversion devices including a pixel having a photoelectric conversion area and a gate area which are formed in a surface portion of a semiconductor substrate of a first conductivity type, the photoelectric conversion area comprising: a first semiconductor layer of a second conductivity type formed in the surface portion of the semiconductor substrate; a second semiconductor layer of the first conductivity type formed on the first semiconductor layer; and a FET including a drain and a source of the second conductivity type formed from the surface of the semiconductor substrate through the second semiconductor layer and a first gate electrode formed on the second semiconductor layer with an insulating layer therebetween, the FET generating signal charges by photoelectric conversion of light incident on the semiconductor substrate through the first gate electrode and the insulating layer, accumulating the signal charges in the second semiconductor layer, and generating an output signal corresponding to the signal charges, the gate area comprising:

a second gate electrode formed on the semiconductor substrate with an insulating layer therebetween, the second gate electrode allowing the signal charges accumulated in the second semiconductor layer in the photoelectric conversion area to flow toward the semiconductor substrate in accordance with an applied voltage to the second semiconductor layer, wherein the second semiconductor layer of the first conductivity type is depleted depending on the applied voltage.

5. An active type solid-state imaging device according to claim 4, wherein the driving circuit area further comprises a level conversion circuit for generating voltages to be applied to the first and second gate electrodes of the plurality of active type photoelectric conversion devices.

6. An active type solid-state imaging device according to claim 4, wherein clock signal voltages applied to the driving circuit area are positive.

7. An active type solid-state imaging device according to claim 4, wherein the image sensor area and the driving circuit area are formed on the semiconductor substrate of the first conductivity type.

* * * * *